US011569326B2

(12) United States Patent
Cai et al.

(10) Patent No.: US 11,569,326 B2
(45) Date of Patent: Jan. 31, 2023

(54) DISPLAY PANEL AND DISPLAY DEVICE

(71) Applicant: Wuhan Tianma Micro-Electronics Co., Ltd., Wuhan (CN)

(72) Inventors: Min Cai, Wuhan (CN); Rili Fei, Wuhan (CN); Yufang Ma, Wuhan (CN); Yangzhao Ma, Wuhan (CN); Ruiyuan Zhou, Wuhan (CN); Zhiqiang Xia, Wuhan (CN); Yingjie Chen, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 251 days.

(21) Appl. No.: 16/591,261

(22) Filed: Oct. 2, 2019

(65) Prior Publication Data
US 2020/0343325 A1   Oct. 29, 2020

(30) Foreign Application Priority Data

Apr. 29, 2019   (CN) .......................... 201910357162.3

(51) Int. Cl.
H01L 27/32 (2006.01)
G06F 3/044 (2006.01)
H01L 27/12 (2006.01)

(52) U.S. Cl.
CPC ........ H01L 27/3269 (2013.01); G06F 3/0447 (2019.05); H01L 27/1218 (2013.01); H01L 27/323 (2013.01); H01L 27/3218 (2013.01); H01L 27/3234 (2013.01)

(58) Field of Classification Search
CPC ............. H01L 27/3218; H01L 27/3234; H01L 27/286; H01L 27/323; H01L 27/1218; G06F 2203/04103; G06F 3/0446; G06F 3/0448; G06F 3/041662; G06F 3/0412; G09F 9/33; G09F 9/35
See application file for complete search history.

(56) References Cited

U.S. PATENT DOCUMENTS

| 2006/0017371 | A1* | 1/2006 | Yamada | H01L 51/0005 |
| | | | | 313/498 |
| 2016/0378224 | A1* | 12/2016 | Kwon | G06F 3/044 |
| | | | | 345/174 |
| 2017/0084668 | A1* | 3/2017 | Wang | G06F 3/0421 |
| 2018/0046281 | A1* | 2/2018 | Pi | G06K 9/0004 |
| 2020/0168691 | A1* | 5/2020 | Choi | H01L 51/5275 |
| 2020/0202098 | A1* | 6/2020 | Zou | G06F 3/044 |
| 2020/0273938 | A1* | 8/2020 | Yoon | H01L 51/0096 |

FOREIGN PATENT DOCUMENTS

| CN | 103887324 A | 6/2014 |
| CN | 108777116 | * 11/2018 |
| CN | 109002229 A | 12/2018 |
| CN | 110061038 A | 7/2019 |

OTHER PUBLICATIONS

Chinese Office Action for related Chinese Application No. 201910357162.3; dated Nov. 30, 2020.

* cited by examiner

Primary Examiner — Ahmed N Sefer
(74) Attorney, Agent, or Firm — von Briesen & Roper, s.c.

(57) ABSTRACT

Disclosed are a display panel and display device. The display panel includes: a sensor setting area and a display area around the sensor setting area, where the sensor setting area includes at least one photosensitive element setting area and each of the at least one photosensitive element setting area is the same.

20 Claims, 24 Drawing Sheets

DISPLAY PANEL AND DISPLAY DEVICE

CROSS-REFERENCES TO RELATED APPLICATIONS

This application claims priority to Chinese patent application No. 201910357162.3 filed on Apr. 29, 2019, disclosure of which is incorporated herein by reference in its entirety.

TECHNICAL FIELD

The present disclosure relates to display techniques and, in particular, to a display panel and a display device.

BACKGROUND

With the development of display technology, more and more display panels and display devices are used in people's daily life and work. In order to improve the user experience, sensor modules, such as cameras, infrared sensors and the like, are typically integrated into existing display device structures.

At present, in order to satisfy a high screen ratio, a sensor setting area is usually disposed in an intermediate area at one end of the display panel, and a sensor module is disposed in a corresponding position in the sensor setting area. However, the existing structure of the sensor setting area results in a poor photosensitive effect of the sensor module.

SUMMARY

Embodiments of the present disclosure provide a display panel and a display device, so as to enable the light transmittance of each photosensitive element setting area to be the same, thereby improving the photosensitive effect of the sensor module.

In a first aspect, the embodiments of the present disclosure provide a display panel.

The display panel includes a sensor setting area and a display area around the sensor setting area.

The sensor setting area includes at least one photosensitive element setting area, and the each of the at least one photosensitive element setting area has a same light transmittance.

In a second aspect, the embodiments of the present disclosure further provide a display device. The display device includes the display panel provided in the first aspect.

The display panel provided by the embodiments of the present disclosure includes a sensor setting area and a display area around the sensor setting area, the sensor setting area includes at least one photosensitive element setting area, and the each photosensitive element setting area has a same light transmittance. That is, the effect of the photosensitive element setting area of the display panel on the light beam is the same. Therefore, when the light beam passes through the display panel and reaches the sensor module, the light information received in each position of the sensor module is uniform, that is, the fidelity effect of the light information is good, thereby improving the photosensitive effect of the sensor module.

DETAILED DESCRIPTION

Figure 1:
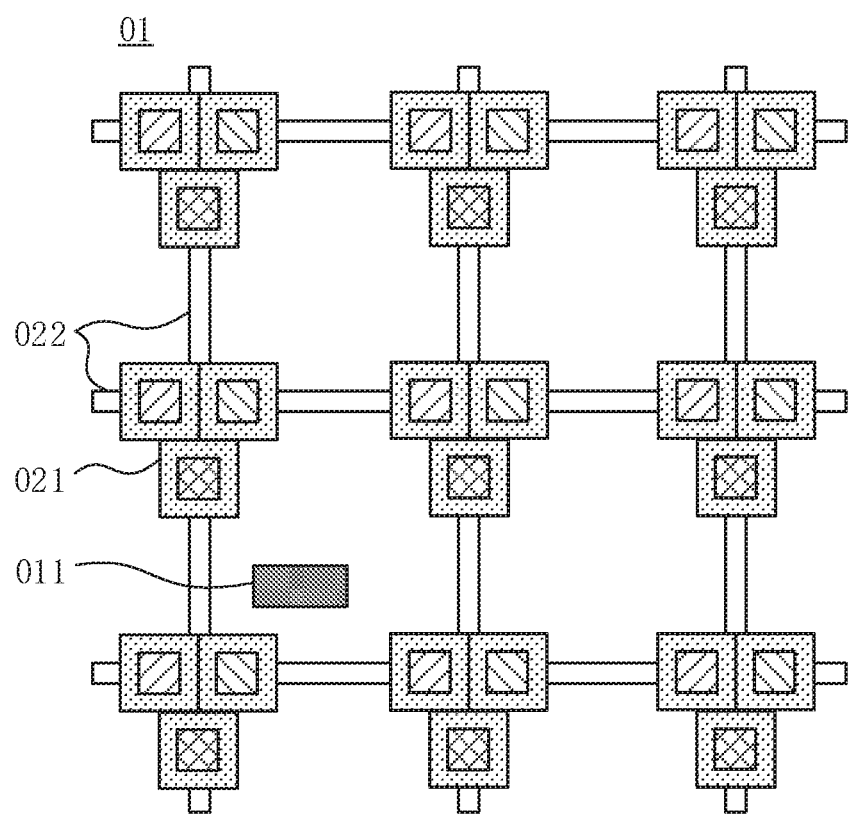
FIG. 1 is a partial structural diagram of a display panel in a related art.

Hereinafter the present disclosure will be further described in detail in conjunction with the drawings and embodiments. It is to be understood that the specific embodiments set forth below are intended to illustrate and not to limit the present disclosure. Additionally, it is to be noted that, for convenience of description, only part, not all, of the structures related to the present disclosure are illustrated in the drawings.

Figure 2:
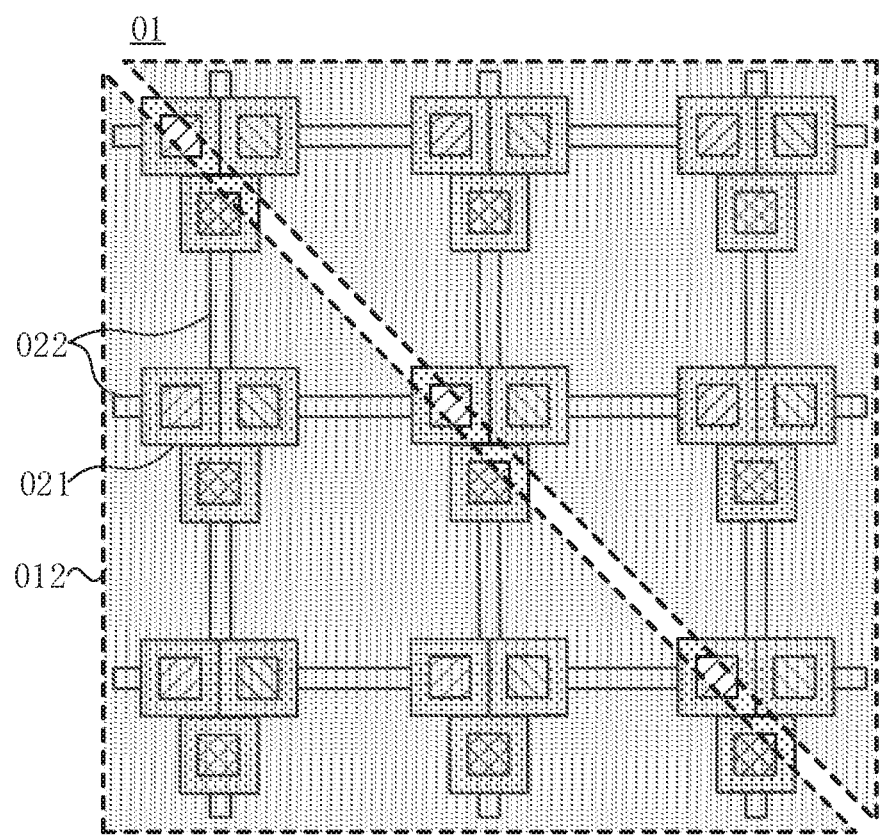
FIG. 2 is a partial structural diagram of another display panel in the related art.

FIG. 1 is a partial structural diagram of a display panel in the related art, and FIG. 2 is a partial structural diagram of another display panel in the related art. Both FIG. 1 and FIG. 2 show exemplarily a structure of a sensor setting area of the display panel. With reference to FIGS. 1 and 2, the sensor setting area of the display panel 01 includes a pixel area 021, a trace area 022, and a blank area other than the pixel area 021 and the trace area 022. Using the sensor module being a camera as an example, the blank area is a photographing area of the camera, and the light transmittance of the photographing area directly affects the photographing effect of the camera. With reference to FIG. 1, a support pillar 011 is disposed in a part of the blank area. Since the support pillar 011 has a function of absorbing the light beam, which will reduce the light transmittance of the place where the support pillar 011 is disposed, there is a difference between the light transmittance of the photographing area where the support pillar 011 is disposed and the light transmittance of the photographing area where no support pillar is disposed, which will affect the photographing effect of the camera. With reference to FIG. 2, other film layers may be provided in the sensor setting area. For example, a functional film layer is provided in the sensor setting area. The functional film layer may include a plurality of (e.g., two) functional film layer blocks 012. Due to a slit between these two adjacent functional film layer blocks 012, a part of the photographing area may be completely covered by the same functional film layer block 012, while the other part of the photographing area not only has partial areas of the two different functional film layer blocks 012, but also has a slit area between these two functional film layer blocks 012. Therefore, due to a difference in the film layer structure corresponding to the different parts of the photographing area, the light transmittance of different parts of the photographing area is also different, thereby affecting the photographing effect of the camera.

In view of the above problems, the embodiments of the present disclosure provide a display panel. The sensor setting area of the display area includes at least one photosensitive element setting area. Each photosensitive element setting area has a same light transmittance. That is, the effect of the photosensitive element setting area of the display panel on the light beam is the same. Therefore, the light information received in each position of the sensor module is uniform, thereby improving the photosensitive effect of the sensor module. This is the core point of the embodiments of the present disclosure, and the display panel and the display device provided in the embodiments of the present disclosure will be exemplarily described below in conjunction with FIGS. 3 to 30.

Figure 3:
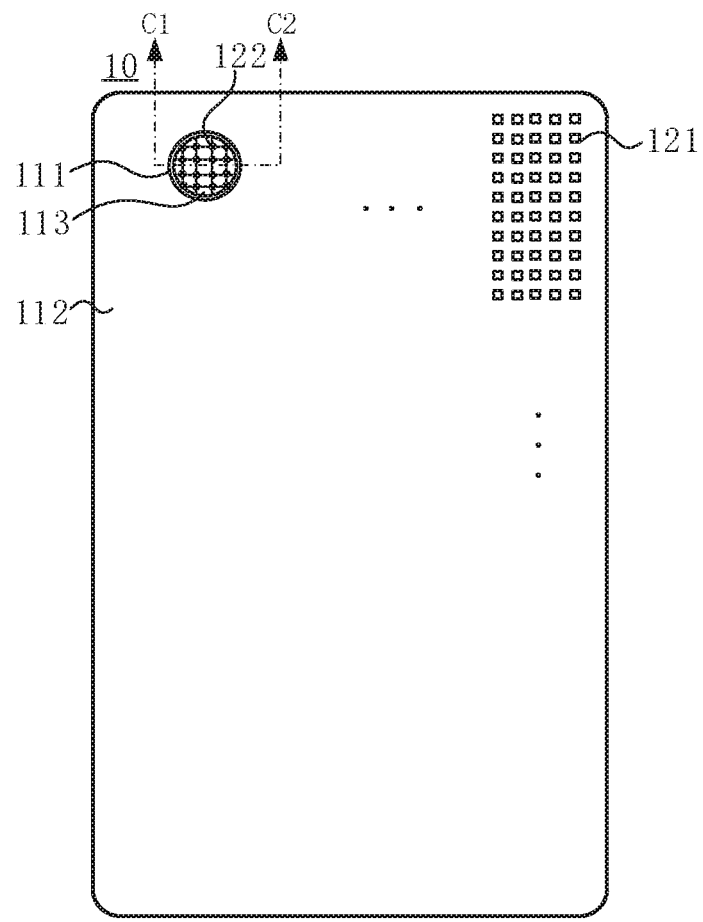
FIG. 3 is a structural diagram of a display panel according to an embodiment of the present disclosure.
Figure 4:
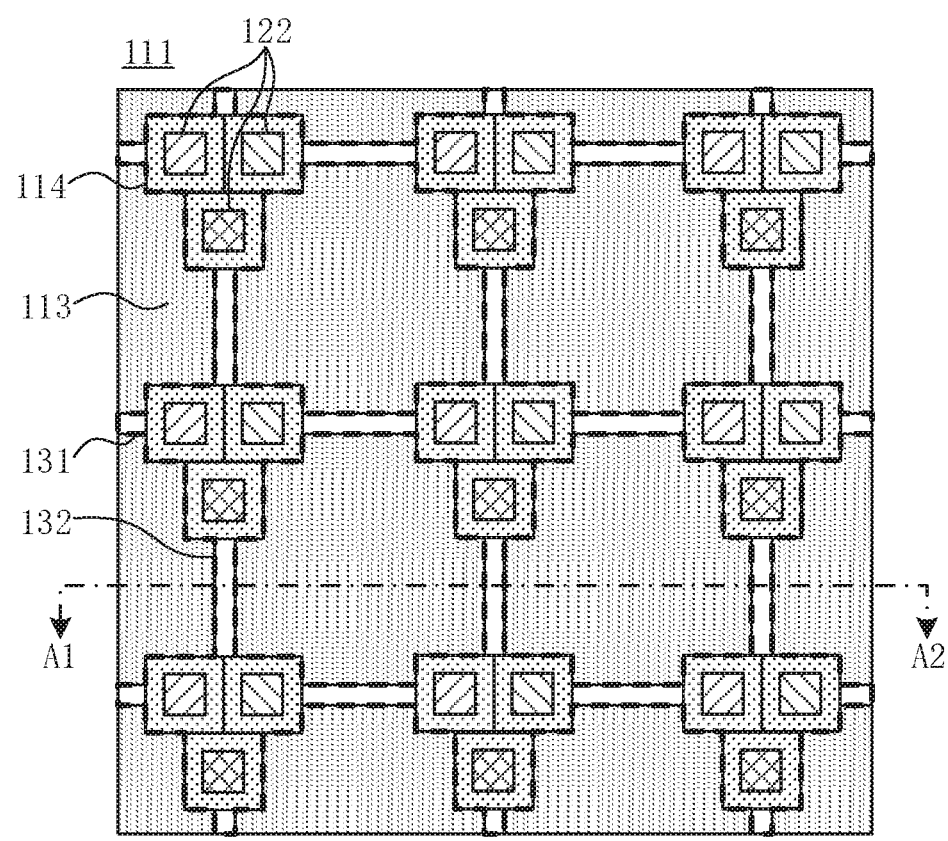
FIG. 4 is a structural diagram of a sensor setting area of another display panel according to an embodiment of the present disclosure.

Exemplarily, FIG. 3 is a structural diagram of a display panel according to an embodiment of the present disclosure, and FIG. 4 is a structural diagram of a sensor setting area of another display panel according to an embodiment of the present disclosure. With reference to FIGS. 3 and 4, the display panel 10 includes a sensor setting area 111 and a display area 112 around the sensor setting area 111. The sensor setting area 111 includes at least one photosensitive element setting area 113. The each photosensitive element setting area 113 has a same light transmittance.

The display area is configured to display images. The photosensitive element setting area 113 in the sensor setting area 111 is configured to place the photosensitive element. By setting the light transmittance of each photosensitive element setting area 113 to be the same, in a light-entering path of each photosensitive element, uniformity of the light transmittance of the photosensitive element setting area 113 in the display panel is high, so that uniformity of light information received by a photosensitive element at the corresponding position is high, thereby improving the photosensitive effect of the sensor module.

Exemplarily, the sensor module is a camera, and the photosensitive element setting area 113 corresponds to a photographing area of the camera. By setting the light transmittance of each photographing area to be the same, the uniformity of the light information received at each position of the camera may be high, thereby improving the photographing effect of the camera.

First, it is be noted that, in FIG. 3, the shape of the sensor setting area 111 is circular, and the sensor setting area 111 is disposed within the display area 112, that is, the display area 112 surrounds each contour edge of the sensor setting area 111, which, however, does not limit the display panel 10 provided in the embodiments of the present disclosure. In other embodiments, the sensor setting area 111 may also be disposed on one side edge of the display area 112, that is, the display area 112 surrounds a part of contour edges of the sensor setting area 111.

Figure 5:
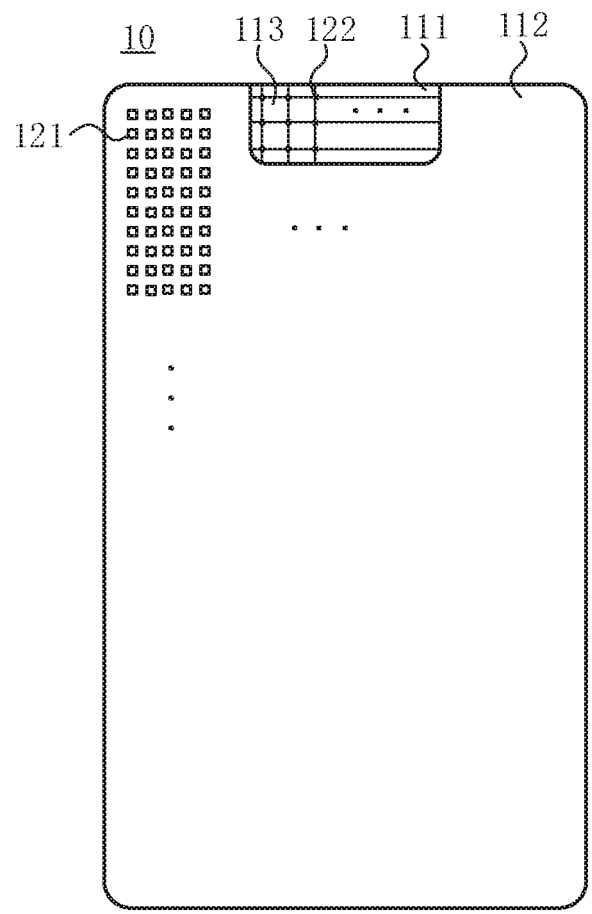
FIG. 5 is a structural diagram of another display panel according to an embodiment of the present disclosure.

Exemplarily, FIG. 5 is a structural diagram of another display panel according to an embodiment of the present disclosure. With reference to FIG. 5, in the display panel 10, the shape of the sensor setting area 11 is square, and the sensor setting area 111 is disposed at the upper edge of the display area 112. That is, the display area 112 surrounds the left contour edge, the right contour edge and the lower contour edge of the sensor setting area 111.

It is to be noted that FIG. 3 merely shows one circular sensor setting area 111 by way of example, and FIG. 5 merely shows one square sensor setting area 111 by way of example, which do not constitute a limitation on the display panel 10 provided in the embodiments of the present disclosure. In other embodiments, the shape and the number of the sensor setting areas 111 and its relative position relationship with the display area 112 may be set in accordance with the actual requirements of the display panel 10, which is not limited by the embodiments of the present disclosure.

What's more, it is to be noted that FIG. 4 merely shows the film layers of each area in the sensor setting area 111 by way of example, and the film layers may be directly visible, which is merely for clearly showing the relative position relationship of each area in the sensor setting area 111, but does not constitute a limitation on the structure of the film layer in the longitudinal direction (the "longitudinal direction" in the present disclosure is understood to be a direction perpendicular to a plane where the base substrate of the display panel 10 is) of the display panel 10. In other embodiments, the structure of film layer in the longitudinal direction of the display panel 10 may be set in accordance with actual requirements of the display panel 10, which is not limited in the embodiments of the present disclosure.

Figure 6:
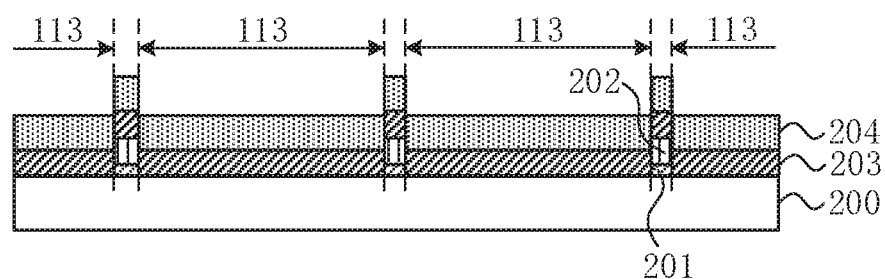
FIG. 6 is a cross-sectional view of FIG. 4 taken along a line A1-A2.
Figure 7:
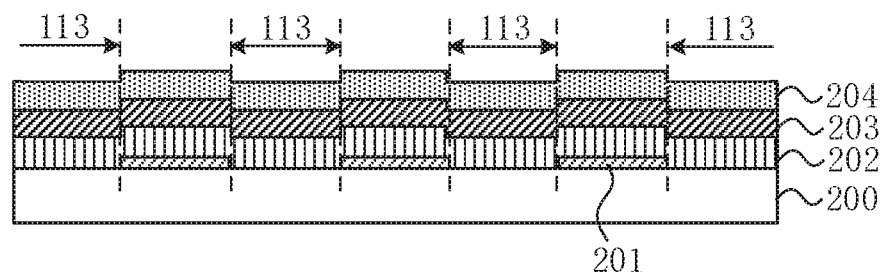
FIG. 7 is another cross-sectional view of FIG. 4 taken along a line A1-A2.

Optionally, FIG. 6 is a cross-sectional view of FIG. 4 taken along a line A1-A2, and FIG. 7 is a cross-sectional view of another display panel according to an embodiment of the present disclosure. With reference to FIGS. 4 to 7, each photosensitive element setting area 113 is the same.

The film layer parameter includes all parameters that are related to the total transmittance of the film layer of the photosensitive element setting area 113 and which may characterize the performance of the film layer. Exemplarily, the film layer parameter may include the number of film layers, the sequence of film formation, the material of a single film layer, the thickness of a single film layer, the light transmittance of a single film layer, and other film parameters known to those skilled in the art, which is not limited in the embodiments of the present disclosure.

By setting the film parameter of each photosensitive element setting area 113 to be the same, it may ensure that the light transmittance of each photosensitive element setting area 113 is the same, thereby ensuring a better photosensitive effect of the sensor module.

Exemplarily, with reference to FIGS. 6 and 7, the film layer stacked sequentially on one side of the first base substrate 200 includes a first transparent layer 201, a second transparent layer 202, a third transparent layer 203 and a fourth transparent layer 204. In FIG. 6, each photosensitive element setting area 113 is provided with two layers of film layers, i.e., the third transparent layer 203 and the fourth transparent layer 204, and in FIG. 7, each photosensitive element setting area 113 is provided with three layers of film layers, i.e., the second transparent layer 202, the third transparent layer 203 and the fourth transparent layer 204, which is merely an exemplary description, and does not constitute a limitation on the display panel 10 provided in the embodiments of the present disclosure. In other embodiments, the number of film layers and other film layer parameters of the photosensitive element setting area 113 may be at in accordance with actual requirements of the display panel 10, and the structure of the film layer in other areas in the sensor setting area 111 other than the photosensitive element setting area 113 may be set, which may include a film layer related to a driving circuit and a film layer related to the light-emitting unit by way of example, or where a film layer of a metal trace layer, a film layer of a metal electrode layer and other non-transparent film layers may be set by way of example, which is not limited in the embodiments of the present disclosure as long as the film layer parameter of each photosensitive element setting area 113 is the same.

Optionally, still referring to FIGS. 3 to 5, the sensor setting area 111 further includes an auxiliary display area 114 (exemplarily, an area range corresponding to the auxiliary display area 114 is shown in dashed lines in FIG. 4); and the display area 112 is provided with first light-emitting units 121 and the auxiliary display area 114 is provided with second light-emitting units 122.

The display area 112 displays the image through the first light-emitting units 121, and the auxiliary display area 114 displays the image through the second light-emitting units 122. By setting the sensor setting area 111 including the auxiliary display area 14, the display of the sensor setting area 111 may be implemented, and by combining the display of this sensor setting area 111 with the display of the display area 12, the proportion of the area displaying the image in the display pal 10 may be increased, that is, the screen ratio is increased, thereby implementing the full-screen display of the display panel 10, that is, implementing the real full screen.

Exemplarily, both the first light-emitting unit 121 and the second light-emitting unit 122 may be any light-emitting unit known to those skilled in the art, and exemplarily, they may be an organic light-emitting unit, a liquid crystal display light-emitting unit, a Mini-LED or a Micro-LED, which is not limited in the embodiments of the present disclosure.

Optionally, still referring to FIGS. 3 to 5, both the first light-emitting unit 121 and the second light-emitting unit 122 are organic light emitting units; and an arrangement density of the first light-emitting unit 121 in the display area 112 is greater than an arrangement density of the second light-emitting unit 122 in the sensor setting area 111.

The organic light-emitting unit may also be referred to as an organic light emitting diode. When organic light-emitting units are in different areas in the same display panel 10, the dimension of each light-emitting unit are generally the same. In this case, if the arrangement density of the organic light-emitting unit is large, the interval between adjacent light-emitting units is small; otherwise, if the arrangement density of the organic light-emitting unit is small, the interval between adjacent light-emitting units is large.

For example, the size of the organic light-emitting unit may be 20 μm to 200 μm. With the pixels per inch (PPI) representing the arrangement density of the organic light-emitting unit, in the display area 112, the PPI of the first light-emitting unit 121 is 400 to 500, and in the sensor setting area 111, the PPI of the second light-emitting unit 122 may be 20 to 500. In the above PPI ranges, the arrangement density of the organic light-emitting unit in the display area 112 is set to be greater than the arrangement density of the organic light-emitting unit in the sensor setting area 111.

With the above arrangement, if the size of the organic light-emitting unit is the same, the interval between the second light-emitting units 122 in the sensor setting area 111 is large, and therefore, an area reserved for setting the photosensitive element setting area 113 is large, thereby improving the total amount of light transmission, and improving the photosensitive effect of the sensor module.

It is to be noted that FIGS. 3 and 5 merely show partial arrangement manners of the first light-emitting unit 121 by way of example, which does not constitute a limitation on the display panel 10 provided in the embodiments of the present disclosure. In other embodiments, the arrangement manner of the first light-emitting unit 121 in the display area 112 and the arrangement manner of the second light-emitting unit 122 in the sensor setting area 111 may be set in accordance with actual requirements of the display panel 10, which is not limited in the embodiments of the present disclosure.

Optionally, still referring to FIGS. 3 to 5, the first light-emitting unit 121 is an organic light-emitting unit, and the second light-emitting unit 122 is a Micro-LED, and the arrangement density of the first light-emitting unit 121 in the display area 112 is equal to the arrangement density of the second light-emitting unit 122 in the sensor setting area 111.

In this case, the size of the organic light-emitting unit is large (e.g., its size is on the order of a hundred microns) and the size of the Micro-LED is small (e.g., its size is on the order of several microns to dozens of microns). Therefore, at the same arrangement density, by setting the second light-emitting unit 122 to be a Micro-LED, a large area may still be reserved in the sensor setting area 111 to set the photosensitive element setting arm 113, thereby ensuring a high amount of light transmission, and improving the photosensitive effect of the sensor module. At the same time, by setting the arrangement density of the organic light-emitting unit in the display area 112 to be the same as the arrangement density of the Micro-LED in the photosensitive element setting area 111, that is, the PPIs of areas of the entire display panel 10 for displaying the image are consistent, the display panel 10 has a better image display effect.

Exemplarily, with the PPI representing the arrangement density, both the PPI of the display area 112 and the PPI of the sensor setting area 111 may be 400, 450 or other values known to those skilled in the art, which may be set in accordance with actual requirements of the display panel 10, and is not limited in the embodiments of the present disclosure.

Figure 8:
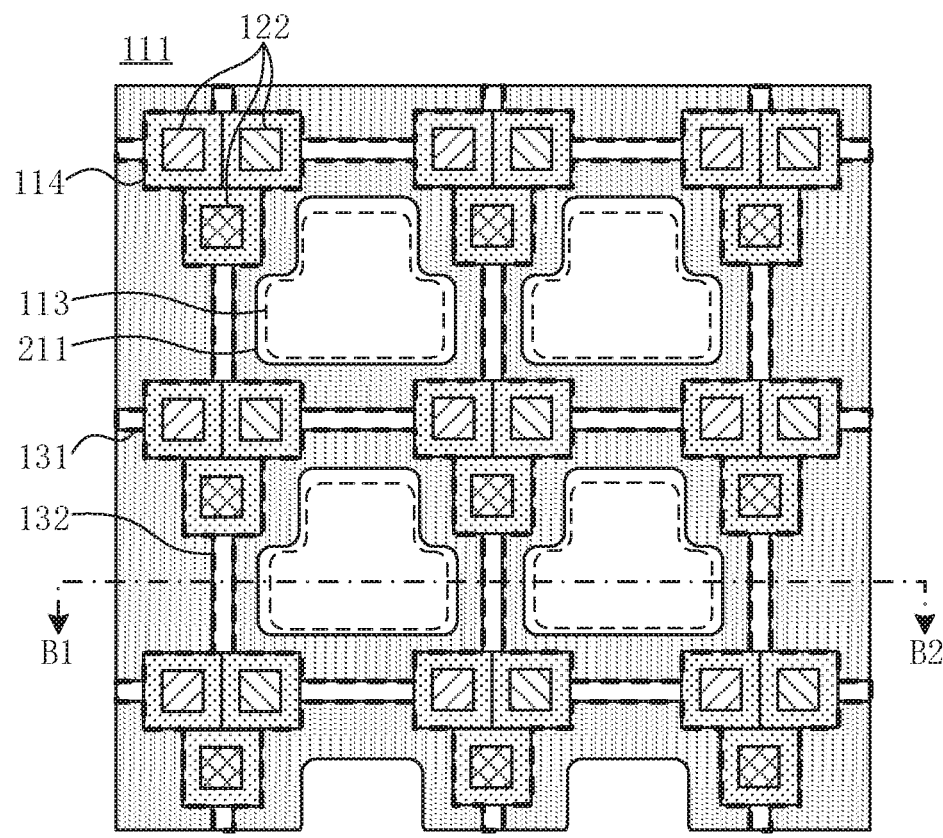
FIG. 8 is a structural diagram of a sensor setting area of another display panel according to an embodiment of the present disclosure.
Figure 9:
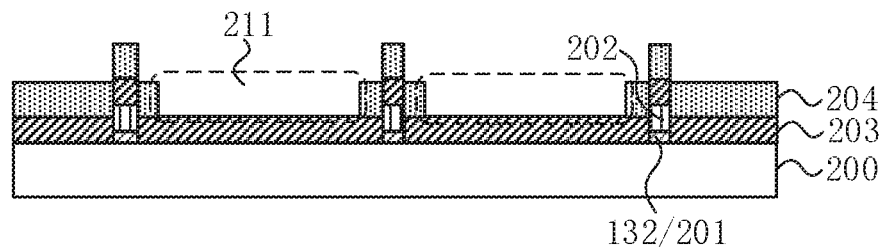
FIG. 9 is a cross-sectional view of FIG. 8 taken along a line B1-B2.

Optionally, FIG. 8 is a structural diagram of a sensor setting area of another display panel according to an embodiment of the present disclosure, and FIG. 9 is a cross-sectional view of another display panel according to an embodiment of the present disclosure, that is, FIG. 9 is a cross-sectional view of FIG. 8 taken along a line B1-B2. With reference to FIGS. 8 and 9, the display panel 10 further includes a first base substrate 200 and a transparent functional film layers disposed on one side of the first base substrate 200 (the third transparent layer 203 and the fourth transparent layer 204 are shown in FIG. 9 by way of example), and at least part of the transparent functional film layers (in FIG. 9, the fourth transparent layer 204 is used as an example) is provided with a hollow pattern in the same position, and the photosensitive element setting area 113 is disposed within a hollow area 211 of the hollow pattern.

The first base substrate 200 may be a flexible substrate or may be a rigid substrate as long as its light transmittance may satisfy the photosensitive requirements of the sensor module under the screen. The material type of the first base substrate 200 is not limited in the embodiments of the present disclosure.

The transmittance of each transparent functional film layers is greater than 40%. Exemplarily, in the case that a complete structure of the organic light-emitting display panel is on a glass substrate, the transparent functional layer may be any transparent film layer related to the driving circuit or to the organic light-emitting unit and known to those skilled in the art, which is not limited in the embodiments of the present disclosure.

Setting the hollow pattern in the same position may be understood as the following setting: when the hollow pattern of the transparent functional film layers is vertically projected onto the plane where the first base substrate 200 is located, the position of the vertical projection of the hollow pattern of each transparent functional film layers is the same.

In this way, on the premise that the light transmittance of each photosensitive element setting area 113 is the same, since the number of film layers in the photosensitive element setting area 113 is reduced, the total amount of absorbed light may be reduced, thereby increasing the light transmittance of the photosensitive element setting area 113, and improving the photosensitive effect of the sensor module.

First, it is to be noted that FIG. 8 merely shows by way of example that the hollow area 211 and the photosensitive element setting area 113 are of the same shape, and both areas are in a split shape of two rounded rectangles, which does not constitute a limitation on the display panel 10 provided in the embodiments of the present disclosure. In other embodiments, the shape of the hollow area 211 and the photosensitive element setting area 113 may be set in accordance with actual requirements of the display panel 10, and the shape of both areas may be the same or may be different, which is not limited in the embodiments of the present disclosure as long as the photosensitive element setting area 113 is disposed in the hollow area 211 of the hollow pattern.

Second, it is to be noted that FIG. 9 merely shows the hollow pattern formed in the fourth transparent layer 204 by way of example, which does not constitute a limitation on the display panel 10 provided in the embodiments of the present disclosure. In other embodiments, two or more layers of the transparent functional film layers may be provided with the hollow pattern in the same position in accordance with the actual requirements of the display panel 10, and transparent functional layers provided with the hollow pattern may be set adjacently or may be set at intervals, which is not limited in the embodiments of the present disclosure.

Figure 10:
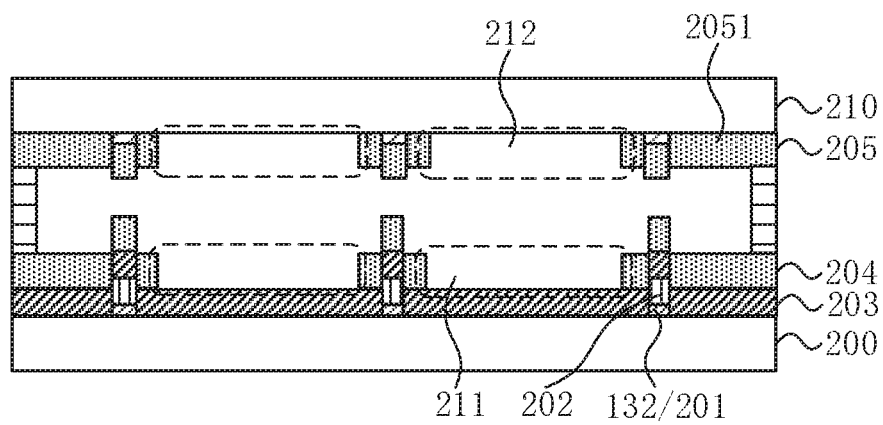
FIG. 10 is another cross-sectional view of FIG. 8 taken along a line B1-B2.
Figure 11:
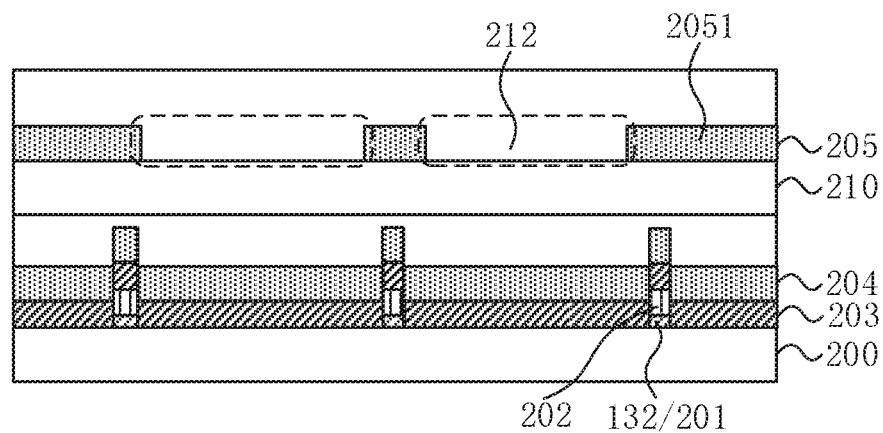
FIG. 11 is another cross-sectional view of FIG. 8 taken along a line B1-B2.

Optionally, FIG. 10 is a cross-sectional view of another display panel according to an embodiment of the present disclosure, which shows another cross-sectional view of FIG. 8 along the line B1-B2, and FIG. 11 is a cross-sectional view of another display panel according to an embodiment of the present disclosure, which shows another cross-sectional view of FIG. 8 taken along the line B1-B2. In conjunction with FIGS. 8 and 11, or in conjunction with FIGS. 8 and 11, the display panel 10 also includes a touch electrode layer 205, the touch electrode layer 205 includes a plurality of sub-touch electrodes 2051, each sub-touch electrode 2051 is provided with a hollow pattern in the sensor setting area 111, and at least pa of the photosensitive element setting area 113 is located within a hollow area 212 of the hollow pattern.

The touch electrode layer 205 is configured to implement a touch function. Therefore, on the basis that the display panel 10 may be used for displaying the image, the display panel 10 also has a touch function, thereby improving the user experience.

Exemplarily, the touch electrode layer 205 may implement the touch function based on a mutual-capacitive touch principle, or may implement the touch function based on a self-capacitive touch principle, which is not limited in the embodiments of the present disclosure.

Exemplarily, FIG. 10 merely shows by way of example that the hollow area of the hollow pattern in the sub-touch electrode 2051 is represented by 212, and the hollow area of the hollow pattern in other transparent functional film layers is represented by 211.

By setting the hollow pattern in the sub-touch electrode 2051 and providing the photosensitive element setting area 113 in the hollow area 212 of the hollow pattern, for the display panel 10 having the touch function, the block of the touch electrode layer 205 to the light incident from the environment into the sensor module may be reduced, thereby increasing in the total amount of light that is capable of being received by the sensor module and improving the photosensitive effect of the sensor module.

Figure 12:
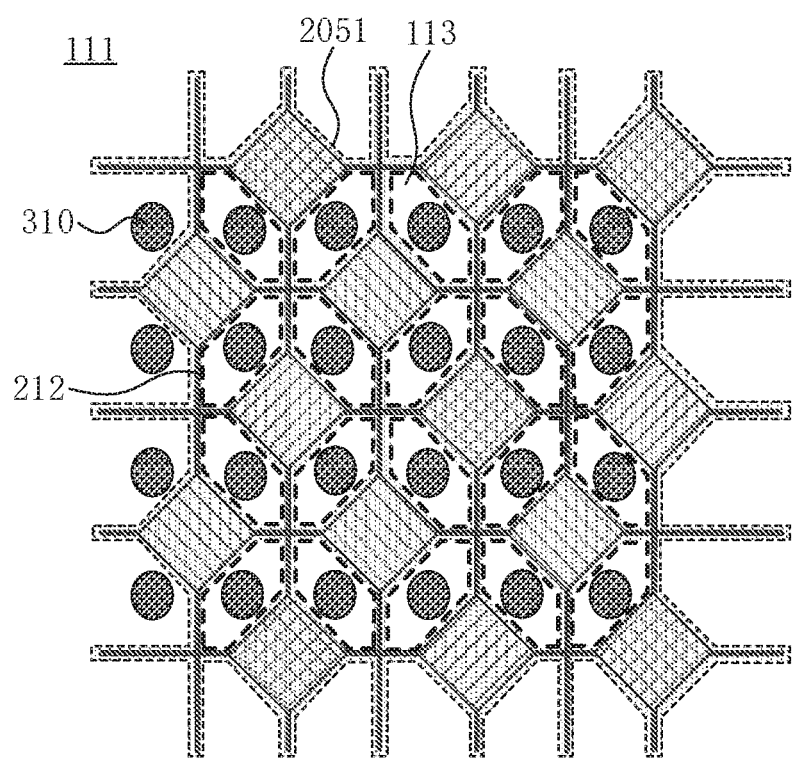
FIG. 12 is a structural diagram of a sensor setting area of another display panel according to an embodiment of the present disclosure.

Exemplarily, FIG. 12 is a structural diagram of a sensor setting area of another display panel according to an embodiment of the present disclosure. With reference to FIG. 12, the dashed line represents contour lines of the sub-touch electrode 2051, including an outer contour line and an inner contour line of the sub-touch electrode 2051. The outer contour line surrounds and defines the sub-touch electrode 2051 and the total volume occupied by the hollow area within the sub-touch electrode 2051, and the inner contour line (shown in dashed dotted lines in FIG. 12 by way of example) surrounds and defines the hollow area 212. Exemplarily, the photosensitive element setting area may be set within each hollow area 212. In a subsequent process, one photosensitive element 310 may be set in each photosensitive element setting area, and each sensor module may be formed of a plurality of photosensitive elements 310. In this way, the light information received by each photosensitive element 310 may be consistent, thereby improving the photosensitive effect of the sensor module.

First, it is to be noted that FIGS. 10 and 11 also show a second base substrate 210, and the relative position relationship between the touch electrode layer 205 and the second base substrate 210 is described in detail below.

Second, it is to be noted that FIG. 12 merely shows one sub-touch electrode 2051 by way of example, this sub-touch electrode 2051 is provided with 20 hollow areas, and the shape of each hollow area is a hexagon, which does not constitute a limitation on the display panel 10 provided in the embodiments of the present disclosure. In other embodiments, the shape of the sub-touch electrode 2051 as well as the number, arrangement manner and shape of the hollow areas in the sub-touch electrode 2051 may be set in accordance with the actual requirements of the display panel 10, which is not limited in the embodiments of the present disclosure.

Figure 13:
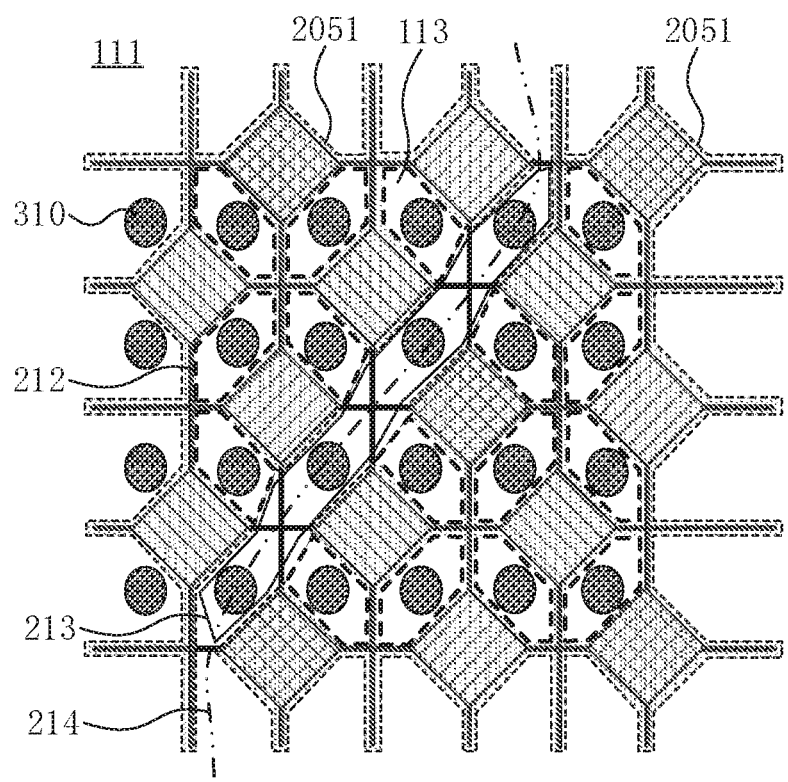
FIG. 13 is a structural diagram of a sensor setting area of another display panel according to an embodiment of the present disclosure.

Optionally, FIG. 13 is a structural diagram of a sensor setting area of another display panel according to an embodiment of the present disclosure. With reference to FIG. 13, at least part of the photosensitive element setting area 113 is also set within the interval 213 of adjacent sub-touch electrodes 2051.

The touch electrode layer is not in the interval 213 between the adjacent sub-touch electrodes 2051, and the touch electrode layer is not in the hollow area 212 of the hollow pattern in each sub-touch electrode 2051 either. That is, the light transmittance of an area corresponding to the interval 213 between the adjacent sub-touch electrodes 2051 is equal to the light transmittance of the hollow area 212 in the sub-touch electrode 2051. When the interval 213 between the adjacent sub-touch electrodes 2051 is large enough to accommodate the photosensitive element 310, the photosensitive element setting area 113 may also be disposed in the interval 213 between the adjacent sub-touch electrodes 2051. Therefore, in a case that the transmittance of each photosensitive element setting area 113 is consistent, the photosensitive element setting area 113 may be uniformly disposed in the plane where the display panel 10 is located, thereby improving the photosensitive effect of the sensor module.

Exemplarily, using the orientation shown in FIG. 13 as an example, the dashed line in the upper left corner surrounds and defines one sub-touch electrode 2051, and the dashed line in the lower right corner surrounds and defines another sub-touch electrode 2051. The two sub-touch electrodes 2051 are set adjacently. Exemplarily, FIG. 13 shows the demarcation position of the two sub-touch electrodes 2051 through a demarcation line 214. The demarcation line 214 is merely used to demarcate the two sub-touch electrodes 2051 more clearly, and is not a structure of the display panel 10. Each sub-touch electrode 2051 is provided with hollow areas 212, and sensor setting areas 113 are disposed in the hollow areas 212 in the sub-touch electrode 2051 and disposed in the interval 213 between adjacent sub-touch electrodes 2051. This is merely an exemplary description of the display panel 10 provided in the embodiments of the present disclosure, and does not constitute a limitation on the display panel 10 provided in the embodiments of the present disclosure. In other embodiments, the arrangement manner of the sub-touch electrode 2051 and the relative position relationship between the sensing element setting area 113 and the sub-touch electrode 2051 may also be set in accordance with the actual requirements of the display panel 10, which is not limited in the embodiments of the present disclosure as long as the light transmittance of each sensing element setting area 113 is equal.

Optionally, still referring to FIG. 10 or FIG. 1, the display panel 10 further includes a second base substrate 210, and the touch electrode layer 205 is disposed on one side of the second base substrate 210.

Using the organic light-emitting display panel as an example, by setting the touch electrode layer 205 on one side of the second base substrate 210 and setting the functional film layers related to the driving circuit and to the organic light-emitting unit on the side of the first base substrate 200, the display function and the touch function of the display panel 10 may be implemented separately on the first base substrate 200 and the second base substrate 210, thereby reducing the mutual interference between the touch signal and the display signal, and ensuring both a better image display effect and a better touch effect of the display panel 10.

Exemplarily, with continued to FIG. 10, the first base substrate 200 and the second base substrate 210 are disposed opposite, the functional film layers related to the driving circuit and to the organic light-emitting unit are disposed on one side of the first base substrate 200 facing towards to the second base substrate 210, and the touch electrode layer 205 is disposed on one side of the second base substrate 210 facing towards the first base substrate 200.

Exemplarily, with continued to FIG. 11, a difference from FIG. 10 is that the touch electrode layer 205 is disposed on one side of the second base substrate 210 facing away from the first base substrate 200, and an insulating protective layer is disposed on one side of the touch electrode layer 205 facing away from the second base substrate 210 to insulate and protect the touch electrode layer 205.

It is to be noted that FIG. 10 merely shows the hollow area 212 in the sub-touch electrode 2051 by way of example, whose size is equivalent to the size of the hollow area 211 in the other transparent functional layers, and FIG. 11 merely shows the hollow area 212 in the sub-touch electrode 2051 by way of example, where neither the third transparent layer 203 nor the fourth transparent functional layer 204 is provided with a hollow area, which does not constitutes a limitation on the display panel 10 provided in the embodiments of the present disclosure.

In other embodiments, a film layer to be formed with the hollow area may be further disposed in accordance with the actual requirements of the display panel 10, so as to ensure that the film layer parameter in each photosensitive element setting area 113 is the same.

Figure 14:
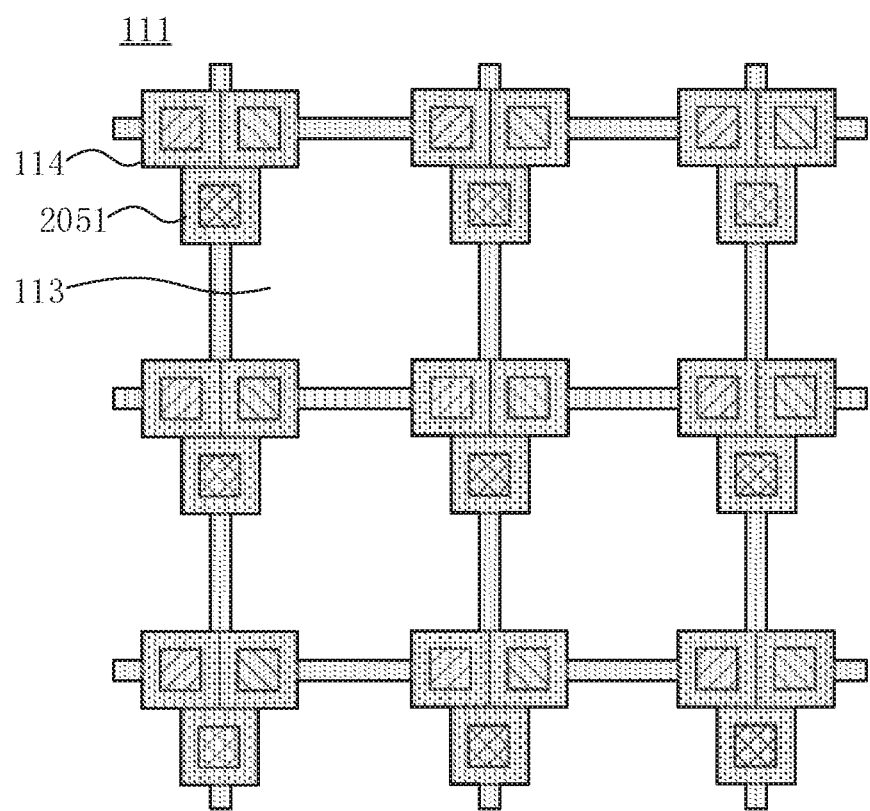
FIG. 14 is a structural diagram of a sensor setting area of another display panel according to an embodiment of the present disclosure.
Figure 15:
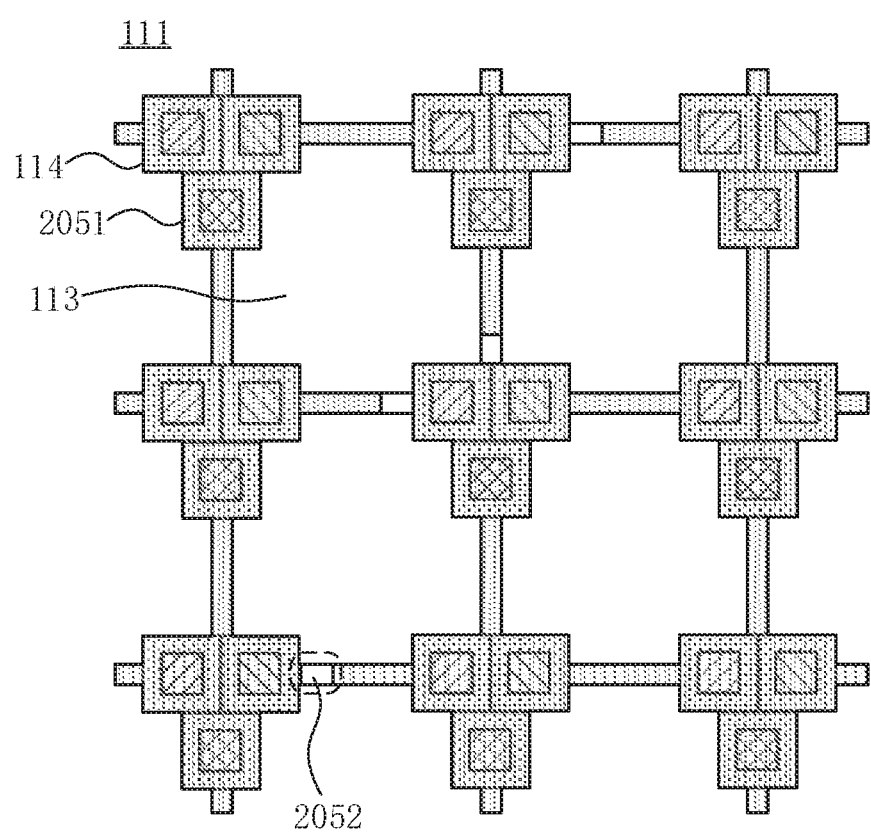
FIG. 15 is a structural diagram of a sensor setting area of another display panel according to an embodiment of the present disclosure.

Exemplarily, FIG. 14 is a structural diagram of a sensor setting area of another display panel according to an embodiment of the present disclosure, and FIG. 15 is a structural diagram of a sensor setting area of another display panel according to an embodiment of the present disclosure. With Reference to FIGS. 14 and 15, vertical projections of the sub-touch electrodes 2051 on the first base substrate 200 are all located within the auxiliary display area 114, and a gap 2052 between adjacent sub-touch electrodes 2051 is provided in an area of the auxiliary display area where no second light-emitting unit is disposed.

The auxiliary display area 114 is an area with low light transmittance in the sensor setting area 111. This area is usually light-proof, that is, its light transmittance is 0%. Exemplarily, the auxiliary display area 114 may include a sub-pixel area and a trace area. The sub-pixel area may be configured to place a pixel driving circuit of the second light-emitting unit and the second light-emitting unit. The trace area may be configured to lay a signal line. This signal line may include a data line, a scan line and other types of signal lines known to those skilled in the art, which is not limited in the embodiments of the present disclosure.

By setting vertical projections of the sub-touch electrodes 2051 on the first base substrate 200 to be all located within the auxiliary display area 114, the sub-touch electrode 2051 no longer occupies other areas of the display panel 10 other than the auxiliary display area 114. Therefore, all areas other than the auxiliary display area 114 may be set as the photosensitive element setting area 113, which increases the area of the photosensitive element setting area 113, thereby improving both the photosensitive effect and the photosensitivity accuracy of the sensor module.

Exemplarily, the area of the auxiliary display area 114 where no second light-emitting unit is disposed may include a trace area and an area where the pixel driving circuit of the second light-emitting unit is disposed, and by setting the gap 2052 between the adjacent sub-touch electrodes 2051 to be disposed in the area of the auxiliary display area 114 where no second light-emitting unit is disposed, on the basis of the above-mentioned increase of the area of the photosensitive element setting area 113, the light emitting effect of the second light-emitting unit is not affected, thereby ensuring a better image display effect of the display panel 10.

Figure 16:
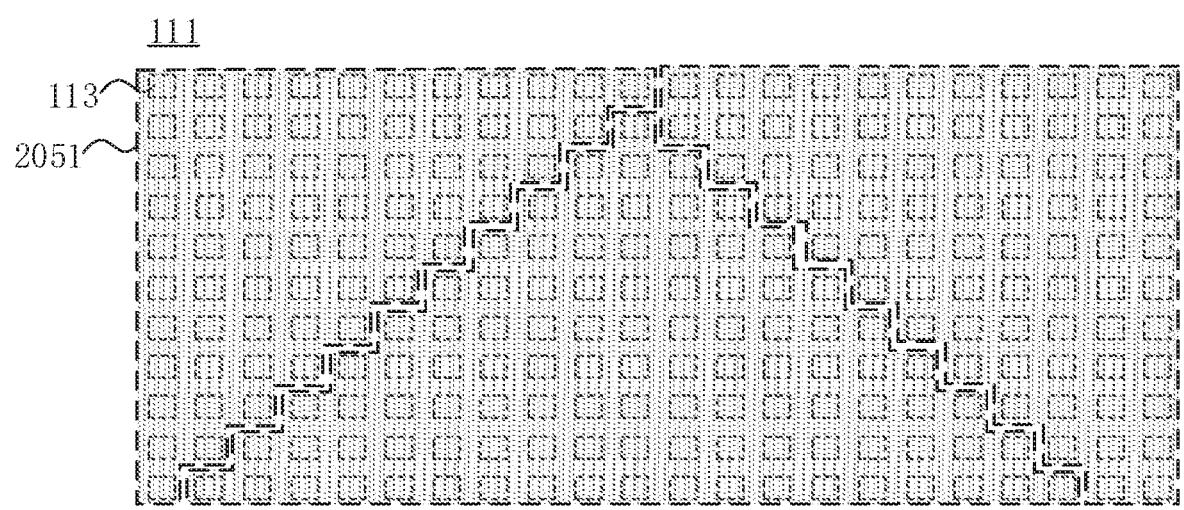
FIG. 16 is a structural diagram of a sensor setting area of another display panel according to an embodiment of the present disclosure.
Figure 17:
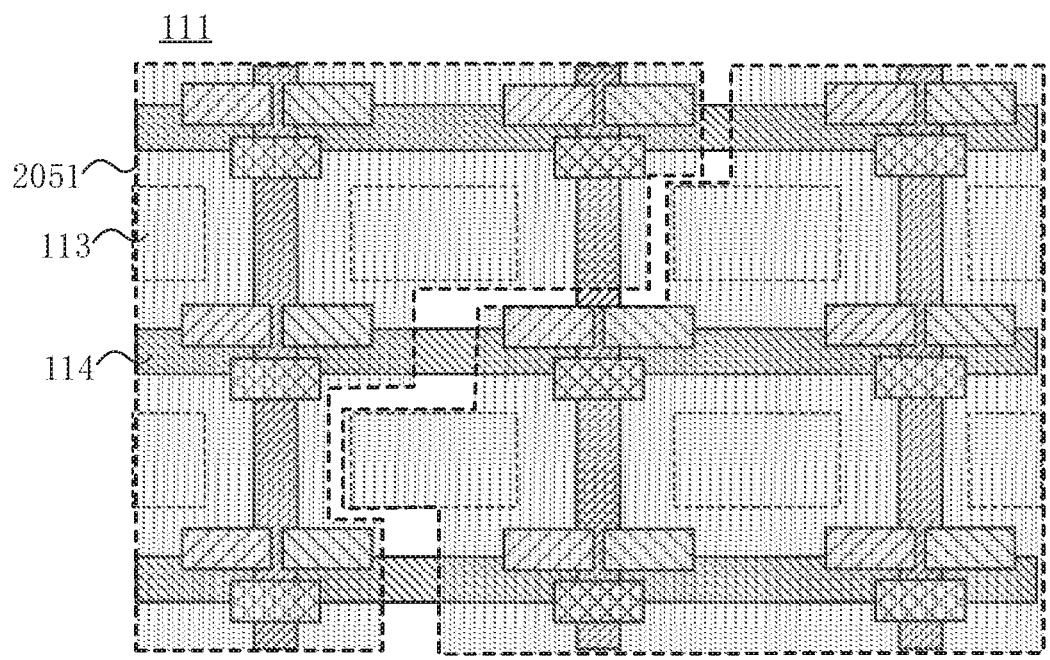
FIG. 17 is a structural diagram of a sensor setting area of another display panel according to an embodiment of the present disclosure.

Exemplarily, FIG. 16 is a structural diagram of a sensor setting area of another display panel according to an embodiment of the present disclosure, and FIG. 17 is a structural diagram of a sensor setting area of another display panel according to an embodiment of the present disclosure. With Reference to FIGS. 16 and 17, the auxiliary display area 114 is covered by vertical projections of the sub-touch electrodes 2051 on the first base substrate 200, and the gap between adjacent sub-touch electrodes 2051 is provided in an area of the sensor setting area other than the photosensitive element setting area 113.

In this way, the gap between the adjacent sub-touch electrodes 2051 may avoid the photosensitive element setting area 113, thereby ensuring that each photosensitive element setting area 113 may be covered by the touch electrode, that is, the light transmittance of all photosensitive element setting areas 113 is the same.

In addition, due to a larger area of the sub-touch electrode 2051, the sensing intensity of the touch signal may be improved, thereby improving the touch sensitivity and the touch accuracy.

Exemplarily, the gap between the adjacent sub-touch electrodes 2051 may be perpendicular to an extending direction of the trace area and cross the trace area in a short-side direction of the trace area, or the gap between the adjacent sub-touch electrodes 2051 may be disposed between the photosensitive element setting area 113 and the trace area and/or between the photosensitive element setting area 113 and the sub-pixel area, or the gap between the adjacent sub-touch electrodes 2051 may be disposed in other areas known to those skilled in the art as long as it avoids the photosensitive element setting area 113, which is not limited in the embodiments of the present disclosure.

Exemplarily, the size of the sub-touch electrode 2051 may be 2 mm to 10 mm, the interval between adjacent sub-touch electrodes may be 20 μm to 500 μm, the size of the sub-pixel area may be 20 μm to 200 μm, and the shape of the photosensitive element setting area 113 may be square whose width-to-length ratio may be 0.2 to 1. This is only an example of the display panel 10 provided in the embodiments of the present disclosure. In other embodiments, the size of each structure described above may also be set in accordance with the actual requirements of the display panel 10, which is not limited in the embodiments of the present disclosure.

It is to be noted that FIGS. 16 and 17 merely show partial structure of the sub-touch electrode 2051 and an arrangement manner of the photosensitive element setting area corresponding to this partial structure by way of example, which does not constitute a limitation on the display panel 10 provided in the embodiments of the present disclosure. In other embodiments, the shape of the arrangement manner of the sub-touch electrode 2051, the size of the interval between sub-touch electrodes 2051, and the shape of the arrangement manner of the photosensitive element setting area 113 corresponding to the sub-touch electrode 2051 may be set in accordance with the actual requirements of the display panel 10, which is not limited in the embodiments of the present disclosure.

Figure 18:
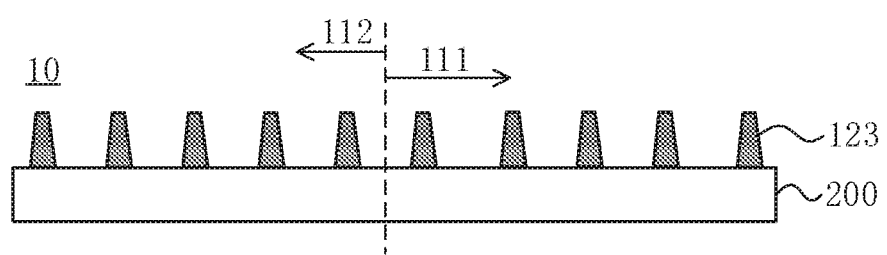
FIG. 18 is a cross-sectional view of another display panel according to an embodiment of the present disclosure.

Optionally, FIG. 18 is a cross-sectional view of another display panel according to an embodiment of the present disclosure. With reference to FIGS. 3 and 18, the display panel 10 further includes the first base substrate 200 and support pillars 123 disposed on one side of the first base substrate 200. The support pillar 123 is disposed in an area other than the photosensitive element setting area 113 in the sensor setting area 111.

The presence of the support pillar 123 affects the light transmittance of the area where the support pillar 123 is disposed. By setting the support pillar 123 to avoid the photosensitive element setting area 113 as described above, the influence of the support pillar 123 on the light transmittance of the photosensitive element setting area 113 may be avoided, thereby ensuring that the light transmittance of the photosensitive element setting area 113 is the same. In addition, by providing the support pillar 123 to support a film layer structure above the support pillar 123 in the display panel 10, the display stability of the display panel 10 and the photosensitive stability of the sensor module may be ensured, that is, improving the photosensitive effect of the sensor module while avoiding the display of water ripples.

Exemplarily, besides the photosensitive element setting area 113, the sensor setting area 111 of the display panel 10 may further include the auxiliary display area 114. The auxiliary display area 114 may include the sub-pixel area and the trace area. The sub-pixel area may be provided with the second light-emitting unit and the pixel driving circuit of the second light-emitting unit. The position where the support pillar 123 may be disposed is illustrated below with reference to FIGS. 19 to 25.

Figure 19:
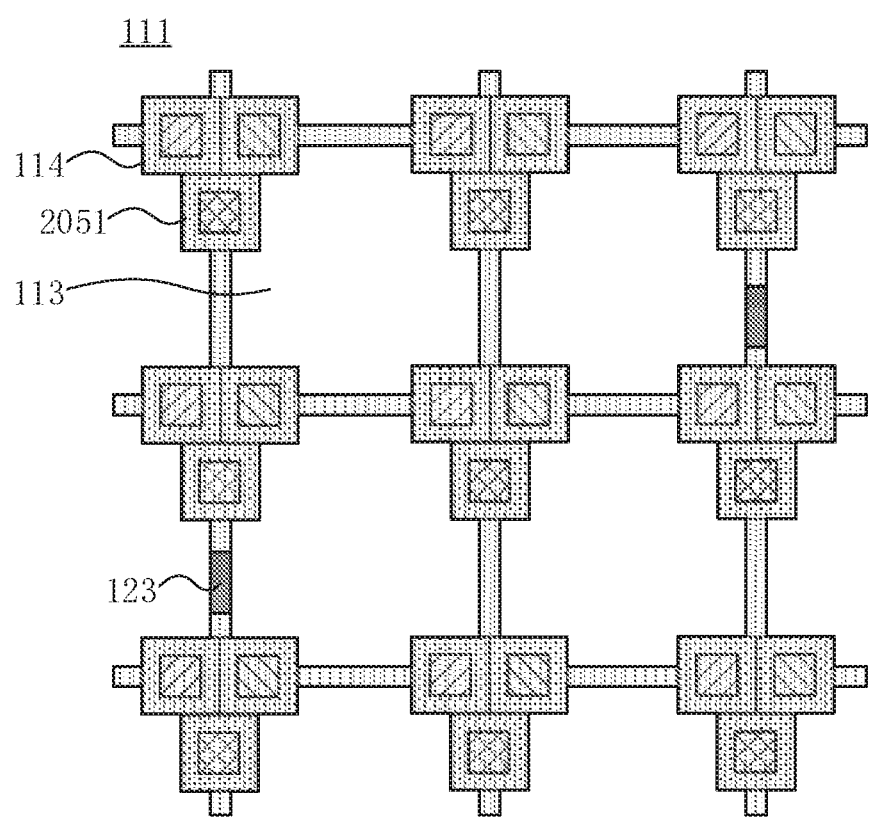
FIG. 19 is a cross-sectional view of FIG. 3 taken along a line C1-C2.

Exemplarily. FIG. 19 is a cross-sectional view of FIG. 3 taken along a line C1-C2. With reference to FIG. 19, each support pillar 123 may be disposed in the trace area, so that the area of each photosensitive element setting area 113 is large and the transmittance of each photosensitive element setting area 113 is the same.

Figure 20:
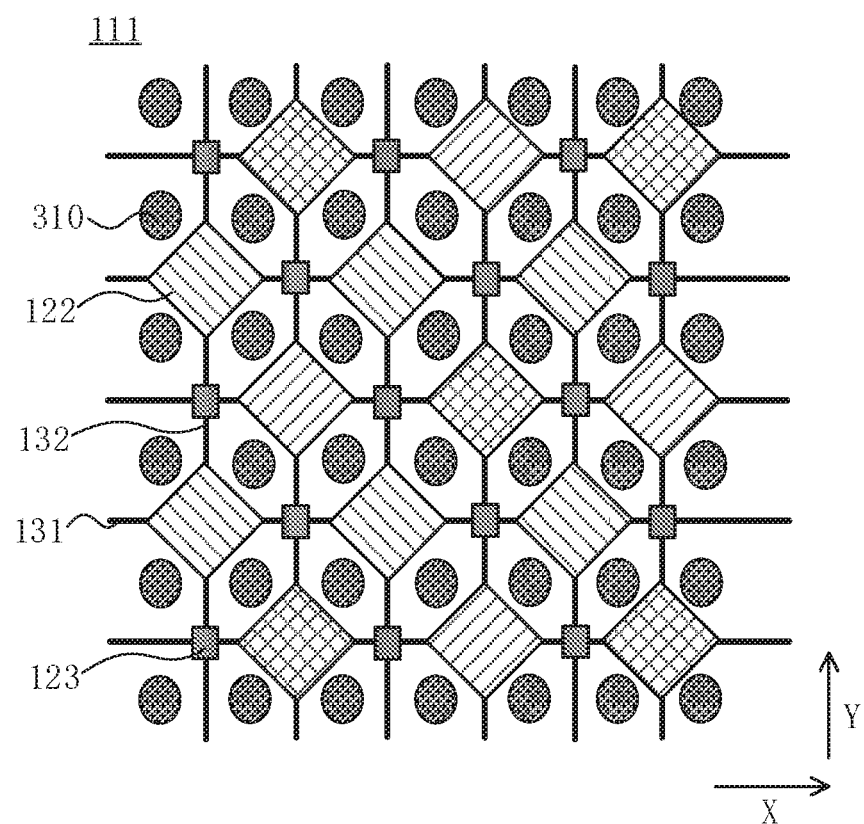
FIG. 20 is a structural diagram of a sensor setting area of another display panel according to an embodiment of the present disclosure.
Figure 21:
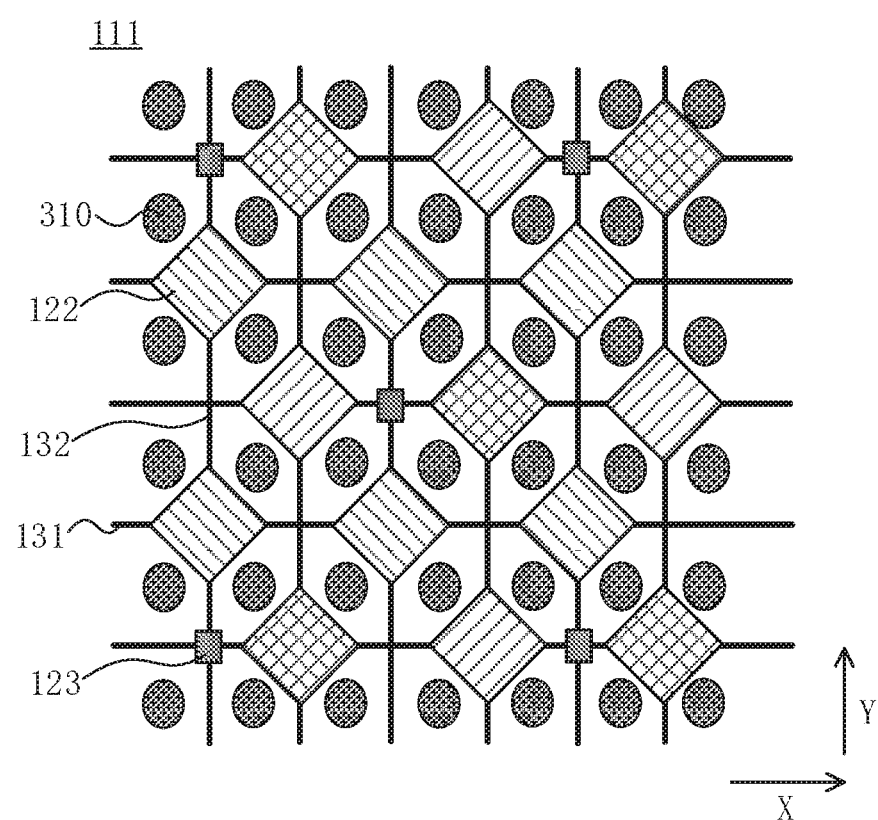
FIG. 21 is a structural diagram of a sensor setting am of another display panel according to an embodiment of the present disclosure.

Exemplarily, FIG. 20 is a structural diagram of a sensor setting area of another display panel according to an embodiment of the present disclosure, and FIG. 21 is a structural diagram of a sensor setting area of another display panel according to an embodiment of the present disclosure. With reference to FIGS. 20 and 21, the auxiliary display area 111 is further provided with a plurality of signal traces. The signal trace includes a first signal line 131 extending in a first direction X and a second signal line 132 extending in a second direction Y. The first direction X and the second direction Y cross. The support pillar 123 is disposed in a position where first signal line 131 and the second signal line 132 cross. Exemplarily, if the first signal line 131 represents a first trace area, the second signal line 132 represents the second trace area, and the support pillar 123 is disposed in the position where the first trace area and the second trace area cross. Therefore, the distribution of the support pillars 123 is even, thereby implementing the uniform support for the sensor setting area 111. With the comparison between FIG. 20 and FIG. 21, it can be seen that the distribution of the support pillars 123 in FIG. 20 is more dense, and the distribution of the support pillars 123 in FIG. 21 is more sparse, which merely shows a distribution density of the support pillars 123 by way of example and does not constitute a limitation on the display panel 10 provided in the embodiments of the present disclosure. In other embodiments, the number and the arrangement density of support pillars 123 may be set in accordance with the actual requirements of the display panel 10, which is not limited in the embodiments of the present disclosure.

Figure 22:
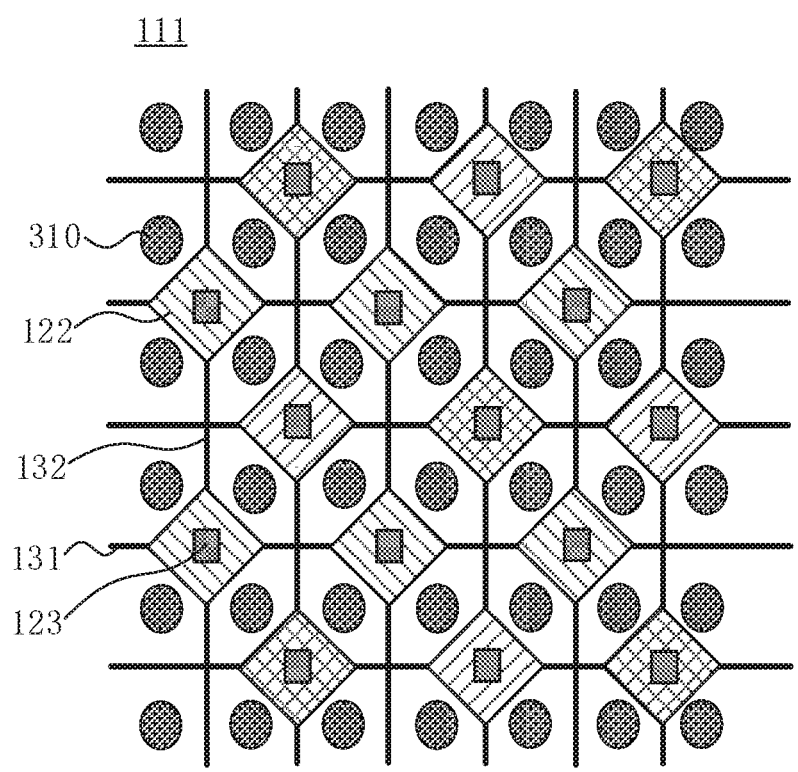
FIG. 22 is a structural diagram of a sensor setting area of another display panel according to an embodiment of the present disclosure.

Exemplarily, FIG. 22 is a structural diagram of a sensor setting area of another display panel according to an embodiment of the present disclosure. With reference to FIG. 22, the support pillars 123 may each be disposed within a sub-pixel area (shown as the second light-emitting unit 122) of the auxiliary display area, and each support pillar 123 is disposed within one sub-pixel area. Due to the area of the sub-pixel area is large with respect to the area of the trace area, positioning and manufacture difficult of the support pillar 123 may also be reduced by setting the support pillar 123 within the sub-pixel area.

Figure 23:
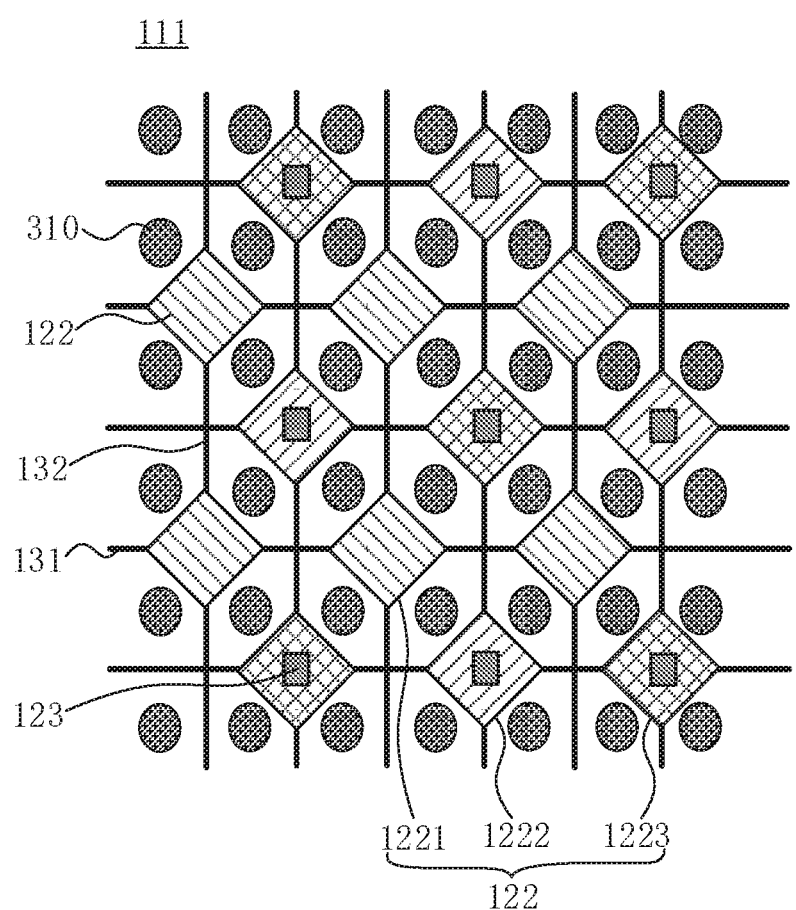
FIG. 23 is a structural diagram of a sensor setting am of another display panel according to an embodiment of the present disclosure.

Exemplarily, FIG. 23 is a structural diagram of a sensor setting area of another display panel according to an embodiment of the present disclosure. With reference to FIG. 23, according to the light-emitting color, the sub-pixel area may be divided into a first color sub-pixel area, a second color sub-pixel area and a third color sub-pixel area, and the support pillars 123 may also be disposed in sub-pixel area of two colors. Exemplarily, each support pillar 123 is disposed in both the second color sub-pixel area and the third color sub-pixel area, instead of the first color sub-pixel area.

Figure 24:
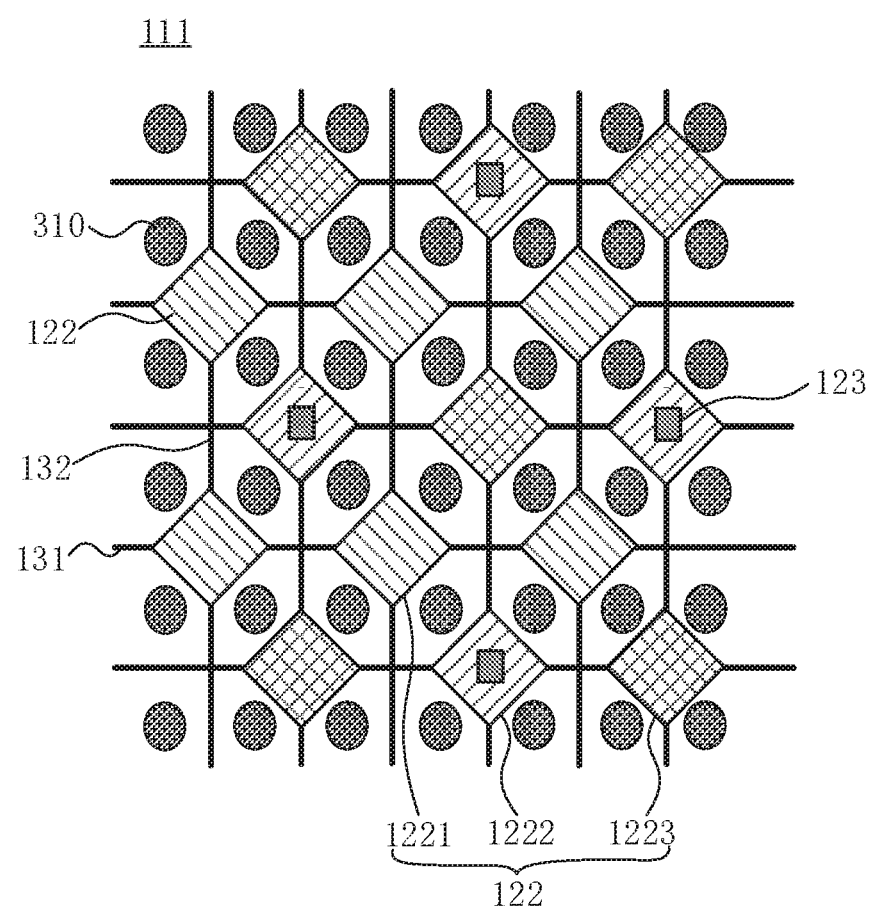
FIG. 24 is a structural diagram of a sensor setting area of another display panel according to an embodiment of the present disclosure.

Exemplarily, FIG. 24 is a structural diagram of a sensor setting area of another display panel according to an embodiment of the present disclosure. With reference to FIG. 24, a similarity between FIG. 23 and FIG. 24 is that the sub-pixel area may be divided into three sub-pixel areas of different light-emitting colors according to the light-emitting color, while a difference from FIG. 23 is that each support pillar 123 is disposed in a sub-pixel area of the same color. Exemplarily, each support pillar 123 is disposed in the second color sub-pixel area instead of the first color sub-pixel area or the third color sub-pixel area.

Figure 25:
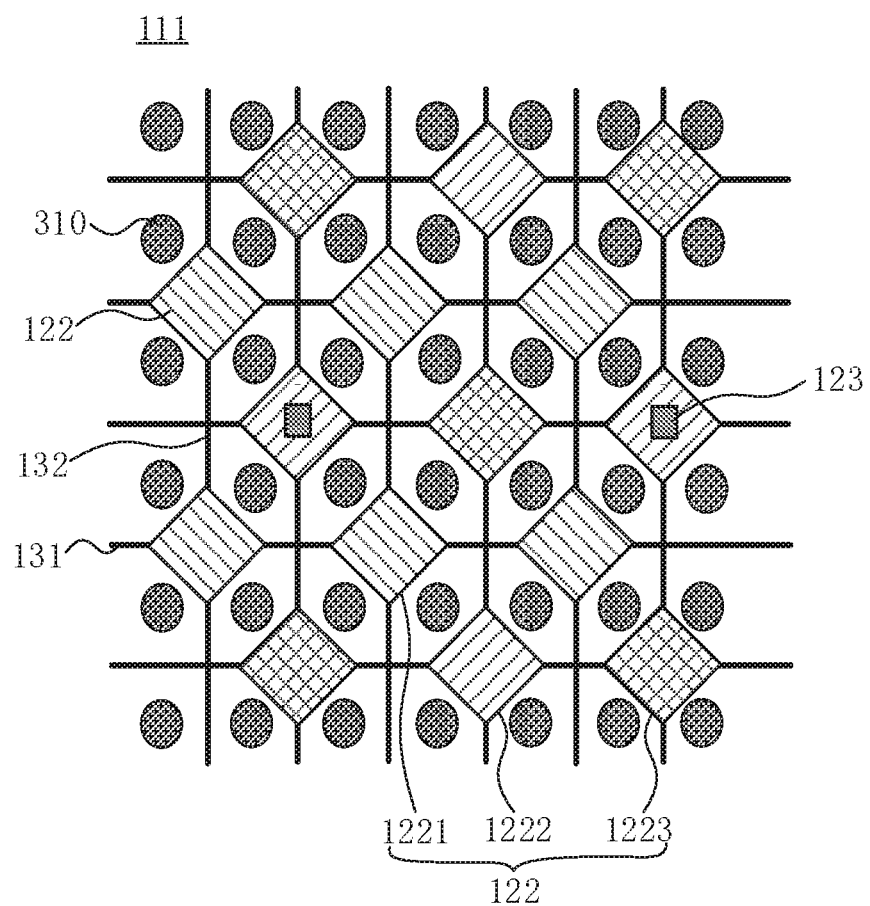
FIG. 25 is a structural diagram of a sensor setting area of another display panel according to an embodiment of the present disclosure.

Exemplarily, FIG. 25 is a structural diagram of a sensor setting are of another display panel according to an embodiment of the present disclosure. With reference to FIG. 25, a similarity between FIG. 25 and FIG. 23 and FIG. 24 is not repeated herein, while a difference from FIG. 23 and FIG. 24 is that support pillars 123 are disposed in a part of sub-pixel areas of the same color. Exemplarily, support pillars 123 are merely disposed in a part of sub-pixels of second color sub-pixel areas, while no support pillar 123 is disposed in the other part of the second color sub-pixel areas and in all first color sub-pixel areas and third color sub-pixel areas.

It is to be noted that the second light-emitting unit 122 may represent the sub-pixel area in the sensor setting area 111. In this way, optionally, still referring to any one of FIGS. 22 to 25, at least part of the second light-emitting units 122 are provided with the support pillar 123, and the support pillar 123 does not overlap the light-emitting area of the second light-emitting unit 122.

The area represented by the second light-emitting unit 122 may further be provided with the pixel driving circuit of the second light-emitting unit 122. By setting the support pillar 123 not to overlap the light-emitting area of the second light-emitting unit 122, the support pillar 123 may not affect the light-emitting effect of the second light-emitting unit 122, thereby ensuring a better image display effect of the display panel 10.

Optionally, still referring to FIGS. 23 to 25, the second light-emitting unit 122 includes a first color light emitting unit 1221, a second color light-emitting unit 1222 and a third color light-emitting unit 1223. The support pillar 123 is disposed in at least one color of the first color light-emitting unit 1221, the second color light-emitting unit 1222 and the third color light-emitting unit 1223 in at least part of the second light-emitting units 122.

The first color, the second color and the third color work together for the display panel 10 to display normally the image. Exemplarily, the first color, the second color and the third color may respectively be one of red, green and blue, or may be other colors known to those skilled in the art, which is not limited in the embodiments of the present disclosure. In other embodiments, the second light-emitting unit 122 may further include a fourth color light-emitting unit or more different color light-emitting units in accordance with the actual display requirements of the display panel 10, which is not limited in the embodiments of the present disclosure.

Exemplarily, the support pillars 123 may merely be disposed in a part of the second light-emitting units 122 of the same color. With reference to FIG. 25, the support pillars 123 are merely disposed in a part of the second color light-emitting units 1222. In another example, the support pillars 123 may merely be disposed in all the second light-emitting units 122 of the same color. With reference to FIG. 24, the support pillars 123 are merely disposed in all the second color light-emitting units 1222. In another example, the support pillars 123 may be disposed in a part of the second light-emitting units 122 of different colors. With reference to FIG. 23, the support pillars 123 are disposed in the second color light-emitting units 1222 and the third color light-emitting units 1223. In another example, the support pillars 123 may be disposed in the second light-emitting units 122 of all colors. Exemplarily, with reference to FIG. 22, each of the first color light emitting units 1221, the second color light-emitting units 1222 and the third color light-emitting units 1223 is provided with a support pillar 123. This is merely an exemplary description of the position of the support pillar 123, and does not constitute a limitation on the display panel 10 provided in the embodiments of the present disclosure. In other embodiments, the relative position relationship between the support pillars 123 and the light-emitting units of different colors in the second light-emitting unit 122 may be set in accordance with the actual requirements of the display panel 10, which is not limited in the embodiments of the present disclosure.

It is to be noted that FIGS. 19 to 25 merely show that the planar shape of the support pillar 123 is square by way of example, and also show the number and interval of the support pillars 123 by way of example, which does not constitute a limitation on the display panel 10 provided in the embodiments of the present disclosure. In other embodiments, the number and shape of the support pillars 123 and the interval between the support pillars 123 may be set in accordance with the actual requirements of the display panel 10, which is not limited in the embodiments of the present disclosure.

Optionally, with reference to FIG. 18, the support pillar 123 is further disposed within the display area 112, and the arrangement density C1 of the support pillars 123 in the sensor setting area 111 is the same as the arrangement density C2 of the support pillars 123 in the display area 112.

In this way, the arrangement density of the support pillars 123 may be the same throughout the whole display panel 10, so that the support effect of the support pillars 123 on the each position of the display panel 10 may be consistent, thereby ensuring a better image display effect of the display panel 10. At the same time, by setting the arrangement density of the support pillars 123 to be consistent, the arrangement of the support pillars 123 may be more regular, thereby reducing the design difficulty and the manufacture difficulty of the display panel 10.

It is to be noted that FIG. 18 merely shows by way of example that the number of support pillars in both the display area 112 and the sensor setting area 111 is five, which is merely a partial structure of the display panel 10 and does not constitute a limitation on the display panel provided in the embodiments of the present disclosure. In other embodiments, the number of the support pillars 123 in both the display area 112 and the sensor setting area 111 may be set in accordance with the actual requirements of the display panel 10. Exemplarily, a ratio of the arrangement density C1 of the support pillars 123 in the sensor setting area 111 to the arrangement density of the support pillars 123 in the display area 112 may also satisfy $0.2 \leq C1/C2 \leq 5$ which is not limited in the embodiments of the present disclosure.

Figure 26:
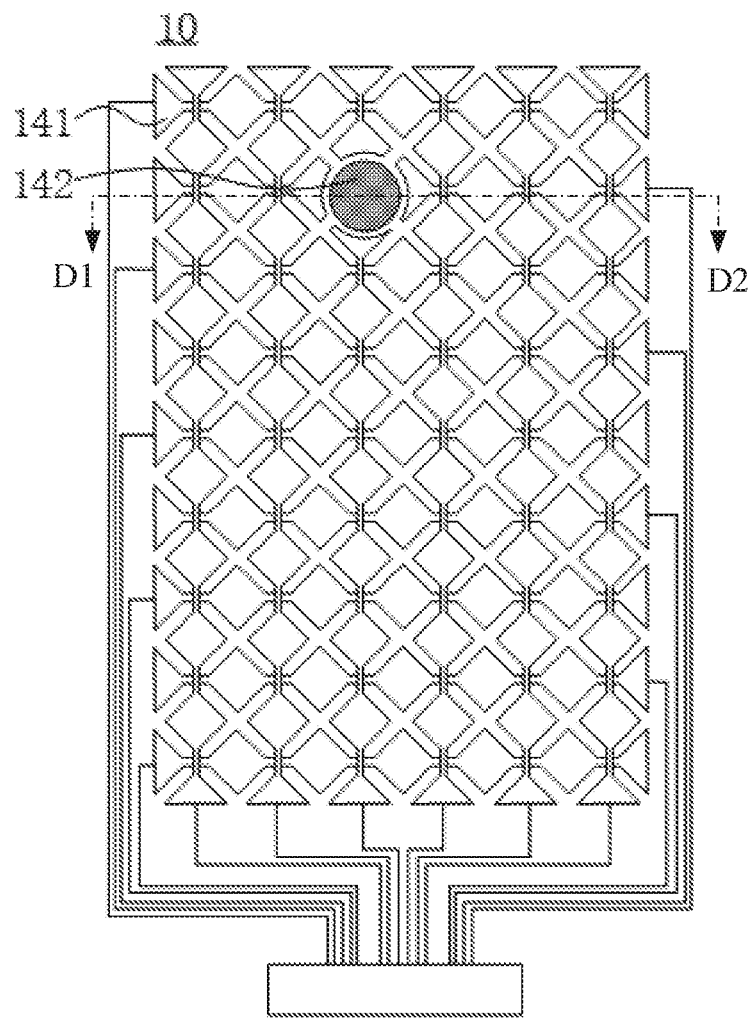
FIG. 26 is a structural diagram of another display panel according to an embodiment of the present disclosure.
Figure 27:
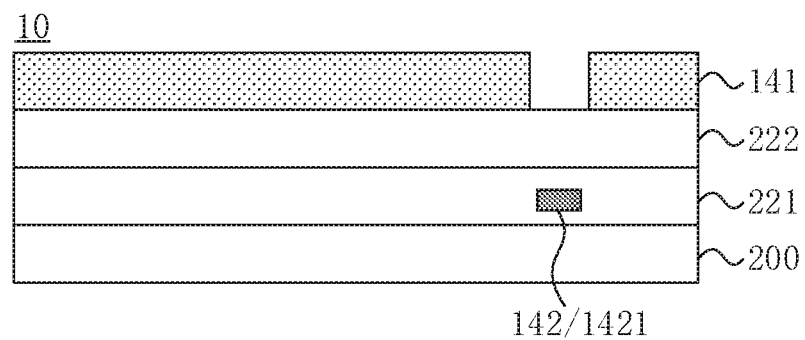
FIG. 27 is a cross-sectional view of FIG. 26 taken along a line D1-D2.

Optionally, FIG. 26 is a structural diagram of another display panel according to an embodiment of the present disclosure, and FIG. 27 is a cross-sectional view of FIG. 26 taken along a line D1-D2. With reference to FIGS. 3, 26 and 27, the display area 112 includes a first touch electrode structures 141, and the sensor setting area 111 includes a second touch electrode structures 142. The first touch electrode structure 141 and the second touch electrode structure 142 are disposed at different film layers. The first touch electrode structure 141 is configured to detect a touch position within the display area 112, and the second touch electrode structure 142 is configured to detect a touch position within the sensor setting area 111.

The first touch electrode structure 141 and the second touch electrode structure 142 are combined to implement touch detection throughout the whole area of the display panel 10.

Exemplarily, the first touch electrode structure 141 may be an embedded structure, and the second touch electrode structure 142 may be an on-cell structure or an external structure.

Optionally, still referring to FIGS. 3, 26 and 27, the first touch electrode structure 141 is a mutual-capacitive touch electrode structure, and the second touch electrode structure 142 includes a self-capacitive touch electrode block 1421. The sensor setting area 111 is completely covered by self-capacitive touch electrode block 1421.

The mutual-capacitive touch electrode structure is disposed in the display area 112 so that the touch performance is good and the sensitivity is high. A self-capacitive touch electrode structure is disposed in a corresponding position of the sensor setting area 111, and the sensor setting are 111 is completely covered by the self-capacitive touch electrode block 1421. In one aspect, the self-capacitive touch electrode block 1421 may be used as a lower electrode and a user's finger serves as an upper electrode to implement the touch detection of the sensor setting area 111, thereby solving the problem of possible touch failure due to the use of the mutual-capacitive touch electrode structure in the sensor setting area 111 when the sensor setting area 111 is large. In another aspect, the sensor setting area 111 may be completely covered by the self-capacitive touch electrode block, so that each photosensitive element setting area in the sensor setting area 111 is provided with the self-capacitive touch electrode block 1421, which may make the light transmittance of each photosensitive element setting area be the same, thereby improving the photosensitive effect of the sensor module.

Optionally, still referring to FIG. 27, the display panel 10 further includes the first base substrate 200, and a display layer 221 and an encapsulation layer 222 stacked on one side of the first base substrate 200. The display layer 221 includes at least one display electrode layer. The self-capacitive touch electrode block 1421 and one of the at least one display electrode layer 221 are disposed at the same layer.

The display layer 221 may be understood as a film layer for implementing normal image display of the display panel, and may include a driving-related film layer of a light-emitting unit, a carrier transport-related film layer of the light-emitting unit, a light-emitting layer, and other film layers known to those skilled in the art, which is not limited in the embodiments of the present disclosure. The display electrode layer may be understood as any film layer for forming the electrode in the display layer 221. By setting the display electrode layer and the self-capacitive touch electrode block 1421 at the same layer, the display electrode layer and the self-capacitive touch electrode block 1421 may also be formed in the same process step by using the same material, thereby simplifying of the film layer structure and the process flow of the display panel 10, reducing the production cost of the display panel 10 and implementing the lighting and thinning design of the display panel 10.

Exemplarily, the display electrode layer includes a transparent electrode layer, such a a transparent (e.g., the light transmittance T≥45%) conductive oxide layer, and the self-capacitive touch electrode block 1421 may be disposed at the same layer as this transparent conductive oxide layer.

It is to be noted that in FIG. 27, the display layer 221 and the encapsulation layer 222 are respectively replaced by merely one film layer by way of example. In the structure of the actual display panel 10, both the display layer 221 and the encapsulation layer 222 may include a plurality of film layers stacked with each other, which may be set in accordance with the actual requirements of the display panel 10 and is not limited in the embodiments of the present disclosure.

Optionally, still referring to FIG. 27, the mutual-capacitive touch electrode structure 141 is disposed on one side of the encapsulation layer 222 facing away from the first base substrate 200.

Therefore, the mutual-capacitive touch electrode structure 141 may be disposed on one side of the encapsulation layer 222 facing away from the display layer 221. That is, the mutual-capacitive touch electrode structure 141 and the self-capacitive touch electrode structure 142 may be disposed respectively in different film layers.

Figure 28:
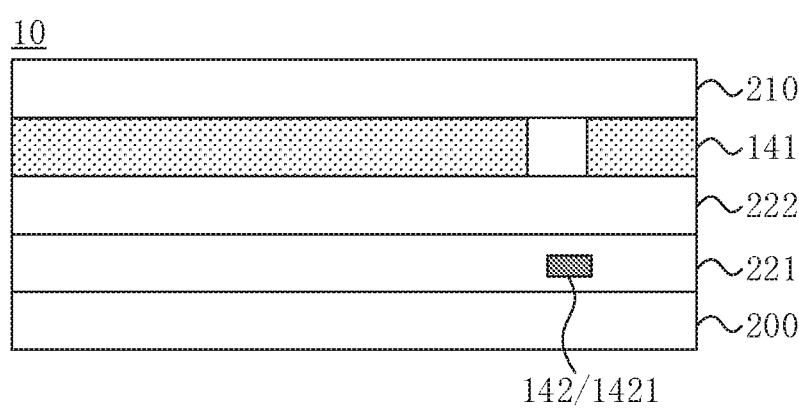
FIG. 28 is another cross-sectional view of FIG. 26 taken along the line D1-D2.

Optionally, FIG. 28 is another cross-sectional view of FIG. 26 taken along the line D1-D2. With reference to FIG. 28, the display panel 10 further includes the second base substrate 210. The second base substrate 210 is disposed on one side of the encapsulation layer 22 facing away from the first base substrate 200. The mutual-capacitive touch electrode structure 141 is disposed between the second base substrate 210 and the encapsulation layer 222.

The second base substrate 210 may be a protective cover plate, and the second base substrate 210 may protect the mutual-capacitive touch electrode structure 141, thereby enhancing the overall stability of the display panel 10 and prolonging the service life of the display panel 10.

In another example, the second base substrate 210 may be a base substrate of the mutual-capacitive touch electrode structure 141. That is, the display panel 10 uses an external touch electrode structure. Therefore, the display function and the touch function of the display panel 10 are implemented separately, thereby improving the production rate of the display panel 10 and reducing the cost of the display panel 10.

It is to be noted that FIG. 26 merely shows by way of example that the touch electrodes in the mutual-capacitive touch electrode structure 141 are in the shape of a prism and the self-capacitive touch electrode structure 142 is circular, and FIGS. 26 and 27 merely show a relative position relationship of film layers of the display panel 10 related to the embodiments of the present disclosure by way of example, which does not constitute a limitation on the display panel 10 provided in the embodiments of the present disclosure. In other embodiments, the shape and arrangement manner of the touch electrodes in the mutual-capacitive touch electrode structure 141, the shape of the self-capacitive touch electrode structure 142, and the film layer structure of the display panel 10 may also be set in accordance with the actual requirements of the display panel 10, which is not limited in the embodiments of the present disclosure.

In addition, it is to be noted that if not in collision, the structure of the display panel 10 shown in the above drawings may be combined or replaced with each other, which is not limited in the embodiments of the present disclosure.

On the basis of the above-mentioned embodiments, an embodiment of the present disclosure further provides a display device. The display device includes any one of the display panels provided in the above-mentioned embodiments. Therefore, the display device also has beneficial effects of the display panel provided in the above-mentioned embodiments; similarities may be understood with reference to the above description and will not be repeated hereinafter.

Figure 29:
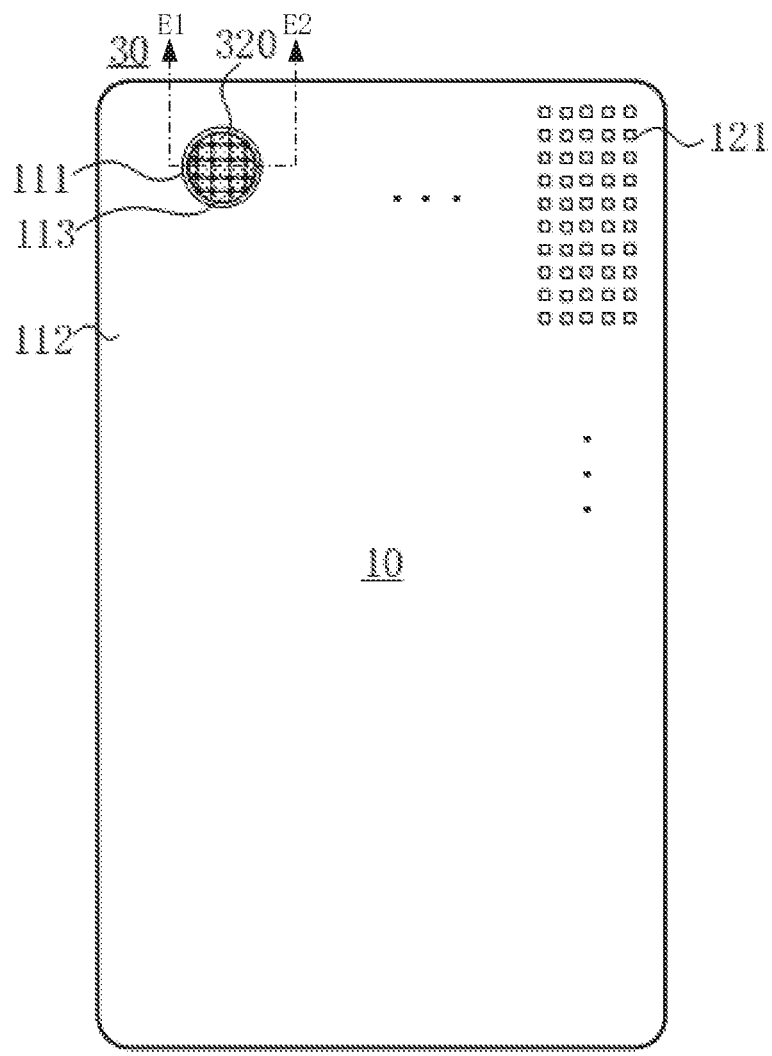
FIG. 29 is a planar structural diagram of a display device according to an embodiment of the present disclosure.
Figure 30:
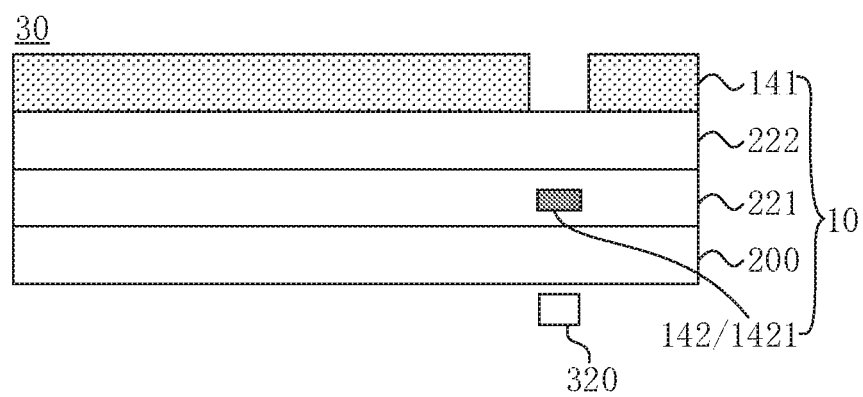
FIG. 30 is a cross-sectional view of FIG. 29 taken along a line E1-E2.

Exemplarily, FIG. 29 is a planar structural diagram of a display device according to an embodiment of the present disclosure, and FIG. 30 is a cross-sectional view of FIG. 29 taken along a line E1-E2. With reference to FIGS. 29 and 30, the display device 30 includes the display panel 10 and a sensor nodule 320 which is correspondingly disposed in the sensor setting are 111.

The sensor module 320 includes one or more of a camera module, a photosensitive sensor, and an ultrasonic distance sensor.

Exemplarily, the display device 30 is a mobile phone or a tablet computer. When the sensor module 320 is the camera module, the sensor setting area 111 corresponds to an area where a front-facing camera of the mobile phone or the tablet computer is disposed, the auxiliary display area is used for display, and the photosensitive element setting area is configured to emit the light beams into the front-facing camera to capture an external image. When the sensor is a photosensitive sensor, the photosensitive sensor may be a photosensitive sensor for sensing external light beams and adjusting the light brightness of the display device, or may be a photosensitive sensor for sensing whether a fingerprint is present externally so as to perform fingerprint recognition. The photosensitive sensor also receives external light beams through the photosensitive element setting area of the sensor setting area 111 and then performs sensing, while the auxiliary display area is configured to display the image together with the display area 112.

Exemplarily, the sensor module 320 may be divided into two types. A photosensitive surface of one type of sensor module 320 is an entire photosensitive surface. The other type of sensor module 320 may include a plurality of sensors. The light beams are sensed through the sensors and photosensitive information of each sensor is integrated, so as to obtain the photosensitive information of the sensor module 320.

Exemplarily, structural diagrams of the display panel 10 shown in FIGS. 3 to 25 are combined. The former type of sensor module 320 requires that the light transmittance at each position in the sensor setting area except the auxiliary display area is the same. That is, this type of the sensor module 320 may be combined with the display panel 10 shown in any of FIGS. 4, 14, 15, and 19 to 25, to ensure a better photosensitive effect of the sensor module 320. The latter type of sensor module 320 requires that the light transmittance in the position of each sensor (i.e., the photosensitive element) is the same, and this type of the sensor module 320 may be combined with the display panel 10 shown in FIGS. 3 to 25, to ensure a better photosensitive effect of the sensor module 320.

In addition, it is to be noted that FIGS. 12, 13, and 20 to 25 merely show a circular photosensitive element (i.e., the sensor) by way of example, which does not constitute a limitation on the display panel 10 and the display device 30 provided in the embodiments of the present disclosure. In other embodiments, the shape, number and arrangement manner of the photosensitive elements may be set in accordance with the actual requirements of the display panel 10 and the display device 30, which is not limited in the embodiments of the present disclosure.

Exemplarily, the display device 30 may be a mobile phone, a tablet computer, a smart wearable device and other display devices known to those skilled in the art, which is not limited in the embodiments of the present disclosure.

It is to be noted that the above are merely preferred embodiments of the present disclosure and the technical principles used therein. It will be understood by those skilled in the art that the present disclosure is not limited to the specific embodiments described herein. Those skilled in the art can make various apparent modifications, adaptations, combinations and substitutions without departing from the scope of the present disclosure. Therefore, while the present disclosure has been described in detail through the above-mentioned embodiments, the present disclosure is not limited to the above-mentioned embodiments and may include more other equivalent embodiments without departing from the concept of the present disclosure. The scope of the present disclosure is determined by the scope of the appended claims.

What is claimed is:

1. A display panel, comprising:
   a sensor setting area and a display area around the sensor setting area;
   wherein the sensor setting area comprises photosensitive element setting areas, and each of the photosensitive element setting areas has a same light transmittance;
   wherein the sensor setting areas further comprises an auxiliary display area; and wherein the display area is provided with first light-emitting units, and the auxiliary display area is provided with second light-emitting units;

wherein the display panel further comprises: a touch electrode layer;

wherein the touch electrode layer comprises a plurality of sub-touch electrodes, and each of the plurality of sub-touch electrodes is provided with a hollow pattern in the sensor setting area; and at least part of the photosensitive element setting areas are disposed within a hollow area of the hollow pattern.

2. The display panel of claim 1, wherein each of the photosensitive element setting areas has a same film layer parameter.

3. The display panel of claim 1, wherein both the first light-emitting units and the second light-emitting units are organic light-emitting units; and wherein an arrangement density of the first light-emitting units in the display area is greater than an arrangement density of the second light-emitting units in the sensor setting area.

4. The display panel of claim 1, wherein the first light-emitting units are organic light-emitting units, and the second light-emitting units are micro-LEDs; and wherein an arrangement density of the first light-emitting units in the display area is equal to an arrangement density of the second light-emitting units in the sensor setting area.

5. The display panel of claim 1, wherein at least part of the photosensitive element setting areas are further disposed within an interval between adjacent sub-touch electrodes.

6. The display panel of claim 1, wherein vertical projections of the plurality of sub-touch electrodes on a first base substrate are all located within the auxiliary display area; and wherein a gap between adjacent sub-touch electrodes is disposed in an area in which no second light-emitting unit is disposed in the auxiliary display area.

7. The display panel of claim 1, wherein the auxiliary display area is covered by vertical projections of the plurality of sub-touch electrodes on a first base substrate; and a gap between adjacent sub-touch electrodes is disposed in an area of the sensor setting area except the photosensitive element setting area areas.

8. The display panel of claim 1, further comprising: a first base substrate and support pillars disposed on one side of the first base substrate;

wherein one part of the support pillars are disposed in an area of the sensor setting area except the photosensitive element setting areas.

9. The display panel of claim 8, wherein the auxiliary display area is further provided with a plurality of signal traces, wherein the plurality of signal traces comprise first signal lines extending in a first direction and second signal lines extending in a second direction, wherein first direction is intersected with the second direction cross; and the support pillars are disposed at positions where the first signal lines and the second signal lines are intersected.

10. The display panel of claim 8, wherein at least part of the second light-emitting units are provided with the support pillars; and the support pillars do not overlap with a light-emitting area of each of the second light-emitting units.

11. The display panel of claim 10, wherein each of the second light-emitting units comprises a first color light-emitting unit, a second color light-emitting unit and a third color light-emitting unit; and the support pillars are disposed in at least one of the first color light-emitting unit, the second color light-emitting unit or the third color light-emitting unit in each of at least part of the second light-emitting unit.

12. The display panel of claim 8, wherein another part of the support pillars are disposed in the display area; and wherein an arrangement density C1 of the one part of the support pillars in the sensor setting area is the same as an arrangement density C2 of the another part of the support pillars in the display area.

13. The display panel of claim 1, wherein the display area comprises first touch electrode structures, and the sensor setting area comprises second touch electrode structures, wherein the first touch electrode structures and the second touch electrode structures are disposed at different film layers, and the first touch electrode structures are configured to detect a touch position within the display area, and the second touch electrode structures are configured to detect a touch position within the sensor setting area.

14. The display panel of claim 13, wherein the first touch electrode structures are mutual-capacitive touch electrode structures, and the second touch electrode structures comprise self-capacitive touch electrode blocks, wherein the sensor setting area is completely covered by the self-capacitive touch electrode blocks.

15. The display panel of claim 14, further comprising a first base substrate, and a display layer and an encapsulation layer stacked on one side of the first base substrate, wherein the display layer comprises at least one display electrode layer, and the self-capacitive touch electrode blocks and one of the at least one display electrode layer are disposed at a same layer.

16. The display panel of claim 15, wherein the mutual-capacitive touch electrode structures are disposed on one side of the encapsulation layer facing away from the first base substrate.

17. The display panel of claim 15, further comprising: a second base substrate, wherein the second base substrate is disposed on one side of the encapsulation layer facing away from the first base substrate, and the mutual-capacitive touch electrode structures are disposed between the second base substrate and the encapsulation layer.

18. A display device, comprising: a display panel; and a sensor module, which is disposed in a sensor setting area;

wherein the display panel comprises:

the sensor setting area and a display area around the sensor setting area;

wherein the sensor setting area comprises photosensitive element setting areas, and each of the photosensitive element setting areas has a same light transmittance;

wherein the sensor setting areas further comprises an auxiliary display area;

wherein the display area is provided with first tight-emitting units, and the auxiliary display area is provided with second light-emitting units;

wherein the display panel further comprises: a touch electrode layer;

wherein the touch electrode layer comprises a plurality of sub-touch electrodes, and each of the plurality of sub-touch electrodes is provided with a hollow pattern in the sensor setting area; and at least part of the photosensitive element setting areas are disposed within a hollow are of the hollow pattern.

19. A display panel, comprising:
a sensor setting area and a display area around the sensor setting area;
wherein the sensor setting area comprises a photosensitive element setting area, and the photosensitive element setting area has a same light transmittance;
wherein the sensor setting areas further comprises an auxiliary display area;
wherein the display area is provided with first light-emitting units, and the auxiliary display area is provided with second light-emitting units;
wherein the display panel further comprises: a first base substrate and transparent functional film layers disposed on one side of the first base substrate;
where at least part of the transparent functional film layers are provided with a hollow pattern at a same position, and the photosensitive element setting are is disposed within a hollow area of the hollow pattern.

20. The display panel of claim 19, further comprising: a second base substrate;
wherein a touch electrode layer is disposed on one side of the second base substrate.

* * * * *